(12) United States Patent
Reiss et al.

(10) Patent No.: US 9,758,697 B2
(45) Date of Patent: Sep. 12, 2017

(54) POLISHING COMPOSITION CONTAINING CATIONIC POLYMER ADDITIVE

(71) Applicant: Cabot Microelectronics Corporation, Aurora, IL (US)

(72) Inventors: Brian Reiss, Woodridge, IL (US); Dana Sauter Van Ness, Forest Park, IL (US); Viet Lam, Naperville, IL (US); Renhe Jia, Naperville, IL (US)

(73) Assignee: Cabot Microelectronics Corporation, Aurora, IL (US)

(*) Notice: Subject to any disclaimer, the term of this patent is extended or adjusted under 35 U.S.C. 154(b) by 0 days.

(21) Appl. No.: 14/639,598

(22) Filed: Mar. 5, 2015

(65) Prior Publication Data
US 2016/0257853 A1  Sep. 8, 2016

(51) Int. Cl.
| | | |
|---|---|---|
| B44C 1/22 | (2006.01) |
| C03C 15/00 | (2006.01) |
| C03C 25/68 | (2006.01) |
| C09K 13/00 | (2006.01) |
| H01L 21/302 | (2006.01) |
| H01L 21/461 | (2006.01) |
| C09G 1/02 | (2006.01) |
| C09G 1/00 | (2006.01) |
| H01L 21/321 | (2006.01) |
| C23F 1/14 | (2006.01) |
| H01L 21/306 | (2006.01) |

(52) U.S. Cl.
CPC ............... *C09G 1/02* (2013.01); *C09G 1/00* (2013.01); *C23F 1/14* (2013.01); *H01L 21/30625* (2013.01); *H01L 21/3212* (2013.01); *H01L 21/32115* (2013.01)

(58) Field of Classification Search
None
See application file for complete search history.

(56) References Cited

U.S. PATENT DOCUMENTS

| | | |
|---|---|---|
| 5,196,353 A | 3/1993 | Sandhu et al. |
| 5,433,651 A | 7/1995 | Lustig et al. |
| 5,609,511 A | 3/1997 | Moriyama et al. |

(Continued)

FOREIGN PATENT DOCUMENTS

WO  WO 2013/125446 A1  8/2013

OTHER PUBLICATIONS

U.S. Appl. No. 14/639,564, filed Mar. 5, 2015.

*Primary Examiner* — Stephanie Duclair
(74) *Attorney, Agent, or Firm* — Thomas Omholt; Erika S. Wilson; Ashlee B. Szelag

(57) ABSTRACT

The invention provides chemical-mechanical polishing compositions and methods of chemically-mechanically polishing a substrate, especially a substrate comprising a silicon oxide layer, with the chemical-mechanical polishing compositions. The polishing compositions comprise first abrasive particles, wherein the first abrasive particles are wet-process ceria particles, have a median particle size of about 75 nm to about 200 nm, and are present in the polishing composition at a concentration of about 0.005 wt. % to about 2 wt. % a functionalized heterocycle, a cationic polymer selected from a quaternary amine, is cationic polyvinyl alcohol, and a cationic cellulose, optionally a carboxylic acid, a pH-adjusting agent, and an aqueous carrier, and have a pH of about 1 to about 6.

34 Claims, 5 Drawing Sheets

(56) References Cited

U.S. PATENT DOCUMENTS

| | | | |
|---|---|---|---|
| 5,643,046 A | 7/1997 | Katakabe et al. | |
| 5,658,183 A | 8/1997 | Sandhu et al. | |
| 5,730,642 A | 3/1998 | Sandhu et al. | |
| 5,838,447 A | 11/1998 | Hiyama et al. | |
| 5,872,533 A | 2/1999 | Snyder et al. | |
| 5,893,796 A | 4/1999 | Birang et al. | |
| 5,949,927 A | 9/1999 | Tang | |
| 5,964,643 A | 10/1999 | Birang et al. | |
| 7,044,836 B2 | 5/2006 | Sun et al. | |
| 7,470,295 B2 | 12/2008 | Kim et al. | |
| 8,138,091 B2 | 3/2012 | Dysard et al. | |
| 8,486,169 B2 | 7/2013 | Carter et al. | |
| 8,617,275 B2 | 12/2013 | Hoshi et al. | |
| 2004/0065022 A1* | 4/2004 | Machii | C09G 1/02 51/309 |
| 2004/0152309 A1 | 8/2004 | Carter et al. | |
| 2006/0096179 A1 | 5/2006 | Lu et al. | |
| 2011/0062376 A1* | 3/2011 | Reiss | C09G 1/02 252/79.5 |
| 2013/0244433 A1* | 9/2013 | Reiss | C09G 1/02 438/693 |
| 2013/0260558 A1* | 10/2013 | Oota | B24B 37/044 438/693 |
| 2015/0017806 A1 | 1/2015 | Akutsu et al. | |

\* cited by examiner

POLISHING COMPOSITION CONTAINING CATIONIC POLYMER ADDITIVE

BACKGROUND OF THE INVENTION

In the fabrication of integrated circuits and other electronic devices, multiple layers of conducting, semiconducting, and dielectric materials are deposited onto or removed from a substrate surface. As layers of materials are sequentially deposited onto and removed from the substrate, the uppermost surface of the substrate may become non-planar and require planarization. Planarizing a surface, or "polishing" a surface, is a process where material is removed from the surface of the substrate to form a generally even, planar surface. Planarization is useful in removing undesired surface topography and surface defects, such as rough surfaces, agglomerated materials, crystal lattice damage, scratches, and contaminated layers or materials. Planarization also is useful in forming features an a substrate by removing excess deposited material used to fill the features and to provide an even surface for subsequent levels of metallization and processing.

Compositions and methods for planarizing or polishing the surface of a substrate are well known in the art. Chemical-mechanical planarization, or chemical-mechanical polishing (CMP), is a common technique used to planarize substrates. CMP utilizes a chemical composition, known as a CMP composition or more simply as a polishing composition (also referred to as a polishing slurry), for selective removal of material from the substrate. Polishing compositions typically are applied to a substrate by contacting the surface of the substrate with a polishing pad (e.g., polishing cloth or polishing disk) saturated with the polishing composition. The polishing of the substrate typically is further aided by the chemical activity of the polishing composition and/or the mechanical activity of an abrasive suspended in the polishing composition or incorporated into the polishing pad (e.g., fixed abrasive polishing pad).

As the size of integrated circuits is reduced and the number of integrated circuits on a chip increases, the components that make up the circuits must be positioned closer together in order to comply with the limited space available on a typical chip. Effective isolation between circuits is important for ensuring optimum semiconductor performance. To that end, shallow trenches are etched into the semiconductor substrate and filled with insulating material to isolate active regions of the integrated circuit. More specifically, shallow trench isolation (STI) is a process in which a silicon nitride layer is formed on a silicon substrate, shallow trenches are formed via etching or photolithography, and a dielectric layer is deposited to fill the trenches. Due to variation in the depth of trenches formed in this manner, it is typically necessary to deposit an excess of dielectric material on top of the substrate to ensure complete filling of all trenches. The dielectric material (e.g., a silicon oxide) conforms to the underlying topography of the substrate. Thus, the surface of the substrate is characterized by raised areas of the overlying oxide between trenches, which are referred to as pattern oxide. Pattern oxide is characterized by the step height of the excess oxide dielectric material lying outside of the trenches. The excess dielectric material is typically removed by a CMP process, which additionally provides a planar surface for further processing. As pattern oxide is abraded and planarity of the surface is approached, the oxide layer is then referred to as blanket oxide.

A polishing composition can be characterized according to its polishing rate (i.e., removal rate) and its planarization efficiency. The polishing rate refers to the rate of removal of a material from the surface of the substrate and is usually expressed in terms of units of length (thickness) per unit of time (e.g., Angstroms (Å) per minute). Planarization efficiency relates to step height reduction versus amount of material removed from the substrate. Specifically, a polishing surface, e.g., polishing pad, first contacts the "high points" of the surface and must remove material in order to form a planar surface. A process that results in achieving a planar surface with less removal of material is considered to be more efficient than a process requiring removal of more material to achieve planarity.

Often the rate of removal of the silicon oxide pattern can be rate-limiting for the dielectric polishing step in STI processes, and therefore high removal rates of the silicon oxide pattern are desired to increase device throughput. However, if the blanket removal rate is too rapid, overpolishing of oxide in exposed trenches results in trench erosion and increased device defectivity.

A need remains for compositions and methods for chemical-mechanical polishing of silicon oxide-containing substrates that will provide useful removal rates while also providing improved planarization efficiency. The invention provides such polishing compositions and methods. These and other advantages of the invention, as well as additional inventive features, will be apparent from the description of the invention provided herein.

BRIEF SUMMARY OF THE INVENTION

The invention provides a chemical-mechanical polishing composition comprising (a) first abrasive particles, wherein the first abrasive particles are wet-process ceria particles, have a median particle size of about 75 nm to about 200 nm, and are present in the polishing composition at a concentration of about 0.005 wt. % to about 2 wt. %, (b) functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer, wherein the cationic polymer is a quaternary amine, and wherein the cationic polymer is present in the polishing composition at a concentration of about ppm to about 250 ppm, (d) a carboxylic acid, wherein the pKa of the carboxylic acid is about 1 to about 6, and wherein the carboxylic acid is present in the polishing composition at a concentration of about 25 ppm to about 500 ppm, (e) a pH-adjusting agent, and (f) an aqueous carrier, wherein the pH of the polishing composition is about 1 to about 6, and wherein the pH of the polishing composition is within about 2 units of the pKa of the carboxylic acid.

The invention also provides a Chemical-Mechanical polishing composition comprising (a) first abrasive particles. Wherein the first abrasive particles are wet-process ceria particles, have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer selected from a cationic polyvinyl alcohol and a cationic cellulose, wherein the cationic polymer is present in the polishing composition at a concentration of about 1 ppm to about 250 ppm, (d) a pH-adjusting agent, and (e) an aqueous carrier, wherein the pH of the polishing composition is about 1 to about 6.

The invention further provides a method of polishing a substrate comprising (i) providing a substrate, wherein the substrate comprises a silicon oxide layer; (ii) providing a polishing pad; (iii) providing a chemical-mechanical polishing composition comprising: (a) first abrasive particles, wherein the first abrasive particles are wet-process ceria particles, have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer, wherein the cationic polymer is a quaternary amine, and wherein the cationic polymer is present in the polishing composition at a concentration of about 1 ppm to about 250 ppm, (d) a carboxylic acid, wherein the pKa of the carboxylic acid is about 1 to about 6, and wherein the carboxylic acid is present in the polishing composition at a concentration of about 25 ppm to about 500 ppm, (e) a pH-adjusting agent, and (f) an aqueous carrier, wherein the pH of the polishing composition is about 1 to about 6, and wherein the pH of the polishing composition is within about 2 units of the pKa of the carboxylic acid; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

The invention still further provides a method of polishing a substrate comprising (i) providing a substrate, wherein the substrate comprises a silicon oxide layer; (ii) providing a polishing pad; (iii) providing a chemical-mechanical polishing composition comprising: (a) first abrasive particles, wherein the first abrasive particles are wet-process ceria particles, have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer selected from a cationic polyvinyl alcohol and a cationic cellulose, wherein the cationic polymer is present in the polishing composition at a concentration of about 1 ppm to about 250 ppm, (d) a pH-adjusting agent, and (e) an aqueous carrier, wherein the pH of the polishing composition is about 1 to about 6; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

BRIEF DESCRIPTION OF THE SEVERAL VIEWS OF THE DRAWING(S)

FIG. 1 illustrates the remaining step height (Å) versus trench loss (Å) for a polishing composition which does not include a cationic polymer or a carboxylic acid (i.e., Polishing Composition 4A), as well as for polishing compositions including a cationic polymer that is a quaternary amine and a carboxylic acid (i.e., Polishing Compositions 4B-4F).

FIG. 2 illustrates the remaining step height (Å) versus trench loss (Å) for (1) a polishing composition which does not include a cationic polymer or a carboxylic acid (i.e., Polishing Composition 5A), (2) polishing compositions which do not include a cationic polymer but include a carboxylic acid (i.e., Polishing Compositions 5B and 5C), and (3) polishing compositions which include a cationic polymer that is a quaternary amine and a carboxylic acid (i.e., Polishing Compositions 5D and 5E).

FIG. 3 illustrates the blanket TEOS removal rate (RR) (Å/min) for (1) a polishing composition which does not include a cationic polymer or a carboxylic acid (i.e., Polishing Composition 5A), (2) polishing compositions which do not include a cationic polymer but include a carboxylic acid (i.e., Polishing Compositions 5B and 5C), and (3) polishing compositions which include a cationic polymer that is a quaternary amine and a carboxylic acid (i.e., Polishing Compositions 5D and 5E).

DETAILED DESCRIPTION OF THE INVENTION

Figure 1:
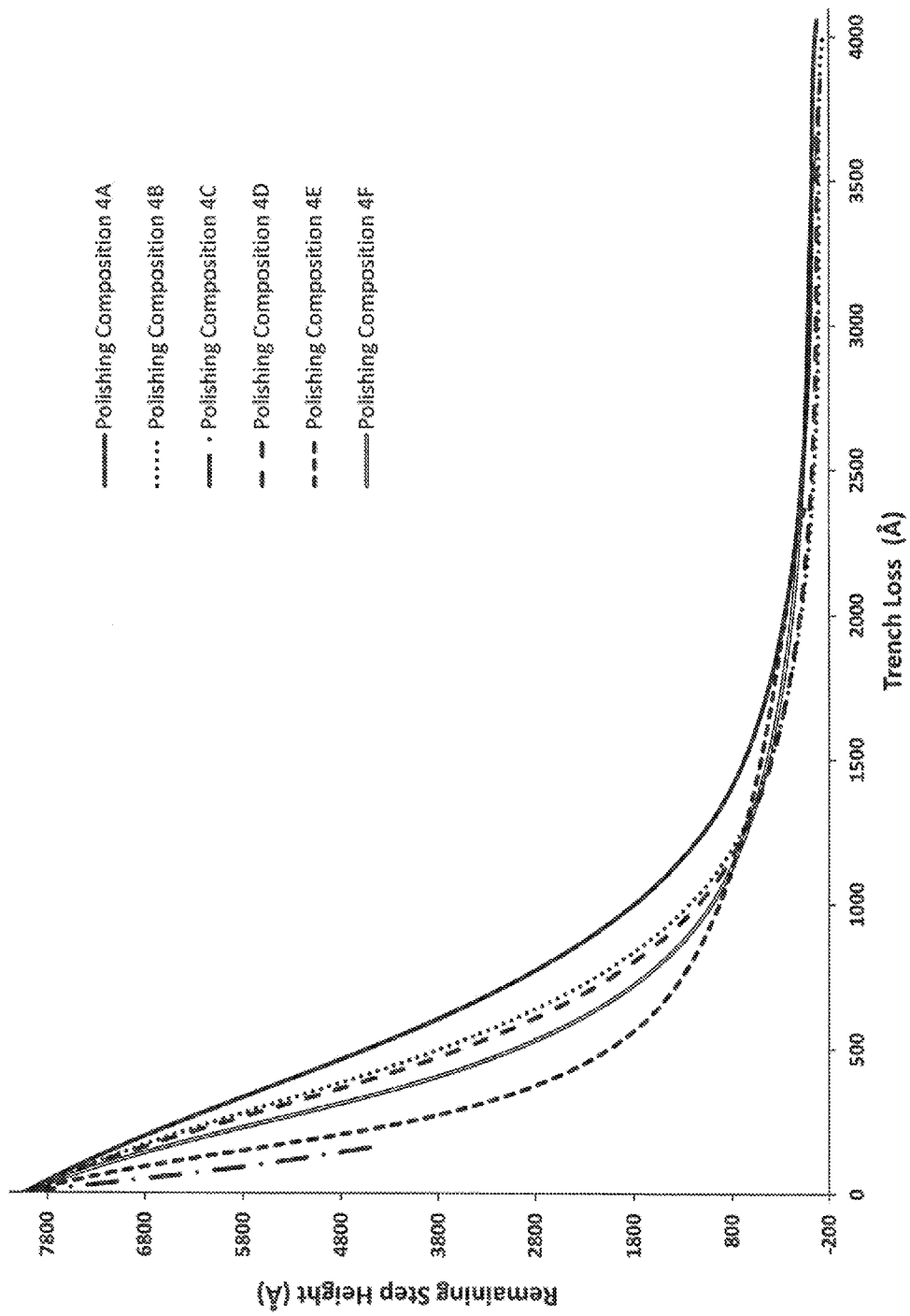

The invention provides chemical-mechanical polishing compositions. In one embodiment, the polishing composition can comprise, consist essentially of, or consist of (a) first abrasive particles, wherein the first abrasive particles are wet-process ceria particles have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer, wherein the cationic polymer is a quaternary amine, and wherein the cationic polymer is present in the polishing composition at a concentration of about 1 ppm to about 250 ppm, (d) a carboxylic acid, wherein the pKa of the carboxylic acid is about 1 to about 6, and wherein the carboxylic acid is present in the polishing composition at a concentration of about 25 ppm to about 500 ppm, (e) a pH-adjusting agent, and (f) an aqueous carrier, wherein the pH of the polishing composition is about 1 to about 6, and wherein the of the polishing composition is within about 2 units of the pKa of the carboxylic acid.

In another embodiment, the polishing composition cart comprise, consist essentially of, or consist of (a) first abrasive particles, wherein the first abrasive particles are wet-process ceria particles, have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer selected from a cationic polyvinyl alcohol and a cationic cellulose, wherein the cationic polymer is present in the polishing composition at a concentration of about 1 ppm to about 250 ppm, (d) a pH-adjusting agent, and (c) an aqueous carrier, wherein the pH of the polishing composition is about 1 to about 6.

The polishing composition comprises first abrasive particles. The first abrasive particles are wet-process ceria particles. For example, the first abrasive particles can be precipitated ceria particles or condensation-polymerized ceria particles, including colloidal ceria particles.

The first abrasive particles have a median particle size of about 75 nm to about 200 nm. The particle size of a particle is the diameter of the smallest sphere that encompasses the particle. The particle size of the first abrasive particles can be measured using any suitable technique. For example, the particle size of the first abrasive particles can be measured using a disc centrifuge, i.e., by differential centrifugal sedimentation (DCS). Suitable disc centrifuge particle size measurement instruments are commercially available, such as from CPS Instruments (Prairieville, La.), e.g., CPS Disc Centrifuge Model DC24000UHR. Unless specified otherwise, the median particle size values reported and claimed herein are based on disc centrifuge measurements.

For example, the first abrasive particles can have a median particle size of about 75 nm or more e.g., about 80 nm or more about 85 nm or more, about 90 nm or more, about 95 nm or more, about 100 nm or more, about 115 nm or more, about 120 nm or more, or about 125 nm or more. Alternatively, or in addition, the first abrasive particles can have a median particle size of about 200 nm or less, e.g., about 185 nm or less, about 175 nm or less, about 165 nm or less, about 160 nm or less, about 150 nm or less, about 140 nm or less, or about 135 DID or less. Thus, the first abrasive particles can have a median particle size within a range bounded by any two of the aforementioned endpoints. For example, the first abrasive particles can have a median particle size of about 75 nm to about 200 nm, e.g., about 75 nm to about 175 nm, about 75 nm to about 150 nm, about 75 nm to about 125 nm, about 75 nm to about 115 nm, about 90 nm to about 150 nm, about 90 nm to about 120 nm, about 100 nm to about 200 nm, or about 100 nm to about 175 nm. Preferably, the first abrasive particles have a median particle size of about 75 am to about 125 am, e.g., a median particle size of about 80 nm, a median particle size of about 85 am, a median particle size of about 95 am, a median particle size of about 100 am, a median particle size of about 105 nm, or a median particle size of about 115 nm.

The first abrasive particles are present in the polishing composition at a concentration of about 0.005 wt. % to about 2 wt. %. For example, the first abrasive particles can be present in the polishing composition at a concentration of about 0.005 wt. % or more, e.g., about 0.0075 wt. % or more, about 0.01 wt. % or more, about 0.025 wt. % or more, about 0.05 wt. % or more, about 0.075 wt. % or more, about 0.1 wt. % or more, or about 0.25 wt. % or more. Alternatively, or in addition, the first abrasive particles can be present in the polishing composition at a concentration of about 2 wt. % or less, about 1.75 wt. % or less, about 1.5 wt. % or less, about 1.25 wt. % or less, about 1 wt. % or less, about 0.75 wt. % or less, about 0.5 wt. % or less, or about 0.25 wt. % or less. Thus, the first abrasive particles can be present in the polishing composition a concentration within a range bounded by any two of the aforementioned endpoints. For example, the first abrasive particles can be present in the polishing composition at a concentration of about 0.005 wt. % to about 2 wt. %, e.g., about 0.005 wt. % to about 1.75 wt. %, about 0.005 wt. % to about 1.5 wt. %, about 0.005 wt. % to about 1.25 wt. %, about 0.005 wt. % to about 1 wt. %, about 0.01 wt. % to about 2 wt. %, about 0.01 wt. % to about 1.5 wt. %, about 0.05 wt. % to about 2 about 0.05 wt. % to about 1.5 wt. %, about 0.1 wt. % to about 2 wt. %, about 0.1 wt. % to about 1.5 wt. %, or about 0.1 wt. % to about 1 wt. %.

Preferably, the first abrasive particles are present in the polishing composition at a concentration of about 0.1 wt. % to about 0.5 wt. %, e.g., about 0.15 wt. % to about 0.4 wt. %, about 0.15 wt. % to about 0.35 wt. %, or about 0.2 wt. % about 0.3 wt. %. More preferably, the first abrasive particles are present in the polishing composition at a concentration of about 0.1 wt. % to about 0.3 wt. %, e.g., about 0.1 wt. %, about 0.15 wt. %, about 0.2 wt. % about 0.25 wt. %, or about 0.28 wt. %.

The polishing composition optionally can comprise additional abrasive particles (e.g. second abrasive particles, third abrasive particles, etc). The additional abrasive particles can be, for example, metal oxide abrasive particles of a different metal than the first abrasive particles, such as metal oxide abrasive particles of zirconia (e.g., zirconium oxide), titania (e.g., titanium dioxide), germania (e.g., germanium dioxide, germanium oxide), magnesia (e.g., magnesium oxide), nickel oxide, co-formed products thereof, or combinations thereof. The additional abrasive particles also can be organic particles of gelatin, latex, cellulose, polystyrene, or polyacrylate.

The additional abrasive particles also can be metal oxide abrasive particles of ceria (e.g., cerium oxide) that are a different type of ceria than first abrasive particles, i.e., ceria particles that are not wet-process ceria particles, such as fumed ceria particles.

The additional abrasive particles also can be wet-process ceria particles that have a different median particle size than the median particle size of the first abrasive particles. Preferably, when the polishing composition comprises second abrasive particles, the second abrasive particles are wet-process ceria particles, and the second abrasive particles have a median particle size that is different from the median particle size of the first abrasive particles.

When the polishing composition includes additional abrasive particles second abrasive particles, third abrasive particles, etc.), the additional abrasive particles can have any suitable median particle size. For example, the polishing composition can include second abrasive particles, and the second abrasive particles can have a median particle size that is smaller than the median particle size of the first abrasive particles, e.g., the second abrasive particles can have a median particle size of about 1 nm to about 100 nm, e.g., about 15 nm to about 95 nm, about 20 nm to about 90 nm, about 25 nm to about 85 nm, about 25 nm to about 80 nm, about 25 nm to about 75 nm, or about 35 nm to about 75 nm. Preferably, the second abrasive particles have a median particle size of about 1 nm to about 60 nm, e.g., about 1 nm to about 55 nm, about 1 nm to about 25 nm, about 10 nm to about 60 nm, about 10 nm to about 55 nm, about 25 nm to about 60 nm, about 30 nm to about 60 nm, or about 35 nm to about 60 nm. More preferably, the second abrasive particles have a median particle size of about 40 nm to about 60 nm, e.g., about 50 nm, about 52 nm, about 54 nm, about 55 nm, or about 58 nm.

Alternatively, the polishing composition can include additional abrasive particles (e.g., second abrasive particles, third abrasive particles, etc.), and the additional abrasive particles can have a median particle size thin is larger than the median particle size of the first abrasive particles. For example, the polishing composition can include second abrasive particles, and the second abrasive particles can have a median particle size of about 125 nm to about 1 µm, e.g., about 125 nm to about 850 nm, about 125 nm to about 750 nm, about 150 nm to about 600 nm, about 150 nm to about 550 nm, about 175 nm to about 500 nm, about 200 nm to about 500 nm, about 225 nm to about 450 nm, or about 250 nm to about 400 nm.

The additional abrasive particles (i.e., the second abrasive particles, third abrasive particles, etc., in total) can be present in the polishing composition at any suitable concentration. Preferably, the additional abrasive particles are present in the polishing composition at a concentration of about 0.005 wt. % to about 2 wt. %. For example, the polishing composition can include second abrasive particles, and the second abrasive particles can be present in the polishing composition at a concentration of about 0.005 wt. % or more, about 0.0075 wt. % or more, about 0.01 wt. % or more, about 0.025 wt. % or more, about 0.05 wt. % or more, about 0.075 wt. % or more, about 0.1 wt. % or more, or about 0.25 wt. % or more. Alternatively, or in addition, the second abrasive particles can be present in the polishing composition at a concentration of about 2 wt. % or less, e.g., about 1.75 wt. % or less, about 1.5 wt. % or less, about 1.25 wt. % or less, about 1 wt. % or less, about 0.75 wt. % or less, about 0.5 wt. % or less, or about 0.25 wt. % or less. Thus, the second abrasive particles can be present in the polishing composition at as concentration within a range bounded by any two of the aforementioned endpoints. For example, the second abrasive particles can be present in the polishing composition at a concentration of about 0.005 wt. % to about 2 wt. %, e.g., about 0.005 wt. % to about 1.75 wt. %, about 0.005 wt. % to about 1.5 wt. %, about 0.005 wt. % to about 1.25 wt. %, about 0.005 wt. % to about 1 wt. %, about 0.01 wt. % to about 2 wt. %, about 0.01 wt. % to about 1.75 wt. %, about 0.01 wt. % to about 1.5 wt. %, about 0.05 wt. % to about 2 wt. %, about 0.05 wt. % to about 1.5 wt. %, about 0.1 wt. % to about 2 wt. %, or about 0.1 wt. % to about 1.5 wt. %. More preferably, the second abrasive particles are present in the polishing composition at a concentration of about 0.01 wt. % to about 0.5 wt. %, e.g., about 0.025 wt. %, about 0.035 wt. %, about 0.05 wt. %, about 0.075 about 0.1 wt. %, about 0.15 wt. %, about 0.25 wt. %, about 0.3 wt. %, or about 0.4 wt. %.

Preferably, when the polishing composition comprises second abrasive particles, the first abrasive particles and the second abrasive particles, in total, are present in the polishing composition at a concentration of about 0.1 wt. % to about 0.5 wt. %. For example, the first abrasive particles and the second abrasive particles, in total, can be present in the polishing composition at a concentration of about 0.1 wt. % to about 0.5 wt. %, e.g., about 0.1 wt. % to about 0.4 wt. %, about 0.1 wt. % to about 0.3 wt. %, about 0.1 wt. % to about 0.25 wt. %, about 0.25 wt. % to about 0.5 wt. %, about 0.25 wt. % to about 0.4 wt. %, or about 0.3 wt. % to about 0.5 wt. %.

The polishing composition preferably has a particle size distribution of at least about 100 nm. More specifically, the first abrasive particles and any additional abrasive particles present in the polishing composition the first abrasive particles; the first abrasive particles and the second abrasive particles; the first abrasive particles, the second abrasive particles, and the third abrasive particles, etc.), preferably have a particle size distribution of at least about 100 nm. The particle size distribution refers to the difference between the particle size of the largest particle and the particle size of the smallest particle. For example, the first abrasive particles and any additional abrasive particles present in the polishing composition can have a particle size distribution of at least about 115 nm, e.g., at least about 125 am, at least about 135 nm, at least about 150 nm, at least about 160 nm, at least about 175 nm, at least about 180 nm, at least about 185 nm, at least about 190 nm, at least about 200 nm, or at least about 225 nm. Typically, the first abrasive particles and any additional abrasive particles present in the polishing composition will have a particle size distribution of about 500 nm or less, about 475 nm or less, about 450 nm or less, about 425 nm or less, or about 4.15 nm or less. Thus, the first abrasive particles and any additional abrasive particles present in the polishing composition can have a particle size distribution within a range bounded by any two of the aforementioned endpoints. For example, the first abrasive particles and any additional abrasive panicles present in the polishing composition can have a particle size distribution of about 100 nm to about 500 nm, e.g., about 100 nm to about 400 nm, about 100 nm to about 350 nm, about 100 nm to about 300 nm, about 100 nm to about 200 nm, or about 115 nm to about 175 nm. Preferably, the first abrasive particles and any additional abrasive particles present in the polishing composition have a particle size distribution of at least about 115 nm, e.g., at least about 120 nm, at least about 125 nm, at least about 130 nm, at least about 140 nm, at least about 150 nm, or at least about 170 nm.

The polishing composition can have any suitable largest particle size and any suitable smallest particle size. Thus, the first abrasive particles and any additional abrasive particles present in the polishing composition (e.g., the first abrasive particles; the first abrasive particles and the second abrasive particles; the first abrasive particles, the second abrasive particles, and the third abrasive particles, etc.) can have any suitable largest particle size and any suitable smallest particle size.

For example, the first abrasive particles and any additional abrasive particles present in the polishing composition can have a smallest particle size of about 1 nm to about 150 nm, e.g., about 1 nm to about 125 nm, about 1 nm to about 100 nm, about 1 nm to about 80 nm, about 1 nm to about 75 nm, about 25 nm to about 125 nm, or about 50 nm to about 100 nm. Preferably, the first abrasive particles and any additional abrasive particles present in the polishing composition have a smallest particle size of about 10 nm to about 75 nm, e.g., about 15 nm, about 25 nm, or about 40 nm, about 50 nm, about 60 nm, or about 70 nm.

The first abrasive particles and any additional abrasive particles present in the polishing composition can have a largest particle size of about 250 nm to about 1 µm, e.g., about 250 nm to about 800 nm, about 250 nm to about 600 nm, about 300 nm to about 750 nm, or about 300 nm to about 500 nm. Preferably, the first abrasive particles and any additional abrasive particles present in the polishing composition have a largest particle size of about 350 nm to about 700 nm, e.g., about 375 nm, about 400 nm, about 500 nm, or about 600 nm.

When the polishing composition comprises additional abrasive particles (e.g., second abrasive particles, third abrasive particles, etc.), the polishing composition optionally can exhibit a multimodal particle size distribution. As used herein, the term "multimodal" means that the polishing composition exhibits a median particle size distribution having at least 2 maxima (e.g., 2 or more maxima, 3 or more maxima, 4 or more maxima, or 5 or more maxima). In particular, when the polishing composition comprises second abrasive particles, the polishing composition can exhibit a bimodal particle size distribution, i.e., the polishing composition exhibits a particle size distribution having 2 median particle size maxima. The terms "maximum" and "maxima" mean a peak or peaks in the particle size distribution. The peak or peaks correspond to the median particle sizes described herein for the first, second, and any additional abrasive particles. Thus, for example, when the polishing composition contains first abrasive particles and second abrasive particles, with no additional abrasive particles, then a plot of the number of particles versus particle size can reflect a bimodal particle size distribution, with a first peak in the particle size range of about 75 nm to about 200 nm and a second peak in the particle size range of about 1 nm to about 60 nm.

The first abrasive particles and any additional abrasive particles present in the polishing composition desirably are suspended in the polishing composition, more specifically in the aqueous carrier of the polishing composition. When the abrasive particles are suspended in the polishing composition, the abrasive particles preferably are colloidally stable. The term colloid refers to the suspension of abrasive particles in the aqueous carrier. Colloidal stability refers to the maintenance of that suspension over time in the context of this invention, abrasive particles are considered colloidally stable if, when the abrasive particles are placed into a 100 ml graduated cylinder and allowed to stand unagitated for a time of 2 hours, the difference between the concentration of particles in the bottom 50 ml of the graduated cylinder ([B] in terms of g/ml) and the concentration of particles in the top 50 ml of the graduated cylinder ([T] in terms of g/ml) divided by the initial concentration of particles in the abrasive composition ([C] in terms of g/ml) is less than or equal to 0.5 (i.e., {[B]−[T]}/[C]≤0.5). The value of [B]−[T]/[C] desirably is less than or equal to 0.3, and preferably is less than or equal to 0.1.

The polishing composition further comprises a functionalized heterocycle selected from a functionalized nitrogen-containing heterocycle, a functionalized sulfur-containing heterocycle, a naphthoic acid, and combinations thereof. The functionalized heterocycle can be functionalized with any suitable functional group. For example, the functionalized heterocycle can be functionalized with a carboxylic acid, a sulfonic acid, a phosphoric acid, an amine, or combinations thereof. Preferably, the functionalized heterocycle is functionalized with a carboxylic acid.

The functionalized nitrogen-containing heterocycle can be any suitable functionalized nitrogen-containing heterocycle. For example, the functionalized nitrogen-containing heterocycle can be selected from a pyridine, a pyrazine, a pyrimidine, a pyridazine, a quinoline, a benzotriazole, as benzothiazole, a triazole, an indole, a benzimidazole, and combinations thereof. In particular, the functionalized nitrogen-containing heterocycle can be selected from picolinic acid, picolylamine, quinaldic acid, and combinations thereof.

The nitrogen of the functionalized nitrogen-containing heterocycle can have any suitable pKa. For example, the nitrogen of the functionalized nitrogen-containing heterocycle can have a pKa of about 5 or more, e.g., about 6 or more, about 8 or more, about 10 or more, or about 15 or more. Preferably, the nitrogen of the functionalized nitrogen-containing heterocycle has a pKa that is greater than the pH of the polishing composition. For example, if the pH of the polishing composition is about 1, the nitrogen of the functionalized nitrogen-containing heterocycle can have a pKa that is more than about 1, e.g., more than about 2, more than about 3, more than about 3.5, more than about 4, more than about 4.5, more than about 5, or more than about 5.5.

The functionalized sulfur-containing heterocycle can be any suitable functionalized sulfur-containing heterocycle. For example, the functionalized sulfur-containing heterocycle can be a thiophene. In particular, the functionalized sulfur-containing heterocycle can be 2-carboxythiophene.

The functionalized heterocycle can be any suitable naphthoic acid. For example, the functionalized heterocycle can be a naphthoic acid selected from 2-hydroxy-1-naphthoic acid, 3-hydroxy-2-naphthoic acid, 3,5-dihydroxy-2-naphthoic acid, 1,4-dihydroxy-2-naphthoic acid, and combinations thereof.

Preferably, the polishing composition comprises a functionalized heterocycle that is a functionalized nitrogen-containing heterocycle. More preferably, the polishing composition comprises a functionalized nitrogen-containing heterocycle selected from a pyridine, a quinoline, and combinations thereof. Even more preferably, the polishing composition comprises a functionalized nitrogen-containing heterocycle selected from picolinic acid, quinaldic acid, and combinations thereof.

Thus, the functionalized heterocycle can comprise a functionalized nitrogen-containing heterocycle, wherein the functionalized nitrogen-containing heterocycle is picolinic acid. In addition, the polishing composition can comprise a functionalized nitrogen-containing heterocycle, wherein the functionalized nitrogen-containing heterocycle is quinaldic acid.

The functionalized heterocycle is present in the polishing composition at a concentration of about 100 ppm to about 1500 ppm. For example, the functionalized heterocycle can be present in the polishing composition at a concentration of about 100 ppm to about 1300 ppm, e.g., about 100 ppm to about 1200 ppm, about 100 ppm to about 1000 ppm, about 100 ppm to about 800 ppm, about 100 ppm to about 750 ppm, about 100 ppm to about 650 ppm, about 100 ppm to about 500 ppm, about 250 ppm to about 1000 ppm, about 250 ppm to about 800 ppm, about 500 ppm to about 1000 ppm, or about 500 ppm to about 800 ppm. Preferably, the functionalized heterocycle is present in the polishing composition at a concentration of about 100 ppm to about 800 ppm, e.g., about 200 ppm, about 300 ppm, about 450 ppm, about 500 ppm, about 600 ppm, about 700 ppm, or about 750 ppm.

The polishing composition further comprises a cationic polymer. The cationic polymer is selected from a quaternary amine, a cationic polyvinyl alcohol, a cationic cellulose, and combinations thereof. In particular, the polishing composition further comprises (a) a cationic polymer, wherein the cationic polymer is a quaternary amine, and wherein the cationic polymer is present in the polishing composition at a concentration of about 1 ppm to about 250 ppm, and a carboxylic acid, wherein the pKa of the carboxylic acid is about 1 to about 6, and wherein the carboxylic acid is present in the polishing composition at a concentration of about 25 ppm to about 500 ppm, or (b) a cationic polymer, wherein the cationic polymer is selected from a cationic polyvinyl alcohol and a cationic cellulose, and wherein the cationic polymer is present in the polishing composition at a concentration of about 1 ppm to about 250 ppm.

The cationic polymer can be any suitable quaternary amine. For example, the cationic polymer can be a quaternary amine selected from poly(vinylimidazolium), a poly(methacryloyloxyethyltrimethylammonium) halide such as poly(methacryloyloxyethyltrimethylammonium) chloride (polyMADQUAT), a poly(diallyldimethylammonium) halide such as poly(diallyldimethylammonium) chloride (polyDADMAC), and polyquaternium-2. Preferably, when the cationic polymer is a quaternary amine, the cationic polymer is poly(vinylimidazolium).

The cationic polymer can be any suitable cationic polyvinyl alcohol or cationic cellulose. Preferably, the cationic polymer is a cationic polyvinyl alcohol. For example, the cationic polyvinyl alcohol can be the Nippon Gosei GOHSEFIMER K210™ polyvinyl alcohol product.

The cationic polymer (i.e., the quaternary amine, the cationic polyvinyl alcohol, the cationic cellulose, or a combination thereof in total) is present in the polishing composition at a concentration of about 1 ppm to about 250 ppm. For example, the cationic polymer can be present in the polishing composition at a concentration of about 1 ppm or more, e.g., about 5 ppm or more, about 10 ppm or more, about 25 ppm or more, about 40 ppm or more, about 50 ppm or more, of about 60 ppm or more. Alternatively, or in addition, the cationic polymer can be present in the polishing composition at a concentration of about 250 ppm or less, e.g., about 225 ppm or less, about 215 ppm or less, about 200 ppm or less, about 175 ppm or less, about 160 ppm or less, about 150 ppm or less, about 125 ppm or less, about 115 ppm or less, or about 100 ppm or less. Thus, the cationic polymer can be present in the polishing composition at a concentration within a range bounded by any of the two aforementioned endpoints. For example, the cationic polymer can be present in the polishing composition at a concentration of about 1 ppm to about 100 ppm, about 1 ppm to about 50 ppm, about 1 ppm to about 40 ppm, about 1 ppm to about 25 ppm, about 5 ppm to about 225 ppm, about 5 ppm to about 100 ppm, about 5 ppm to about 50 ppm, about 10 ppm to about 215 ppm, about 10 ppm to about 100 ppm, about 15 ppm to about 200 ppm, about 25 ppm to about 175 ppm, about 25 ppm to about 100 ppm, or about 30 ppm to about 150 ppm.

When the cationic polymer is poly(vinylimidazolium), the cationic polymer preferably is present in the polishing composition at a concentration of about 1 ppm to about 10 ppm, e.g., about 2 ppm, about 4 ppm, about 5 ppm, about 6 ppm, about 7 ppm, about 8 ppm, or about 9 ppm. More preferably, when the cationic polymer is poly(vinylimidazolium), the cationic polymer preferably is present in the polishing composition at a concentration of about 1 ppm to about 5 ppm, e.g., about 2 ppm, about 3 ppm, or about 4 ppm.

When the cationic polymer is a quaternary amine, the polishing composition further comprises a carboxylic acid. When the cationic polymer is selected from a cationic polyvinyl alcohol and a cationic cellulose, the polishing composition optionally further comprises a carboxylic acid. The pKa of the carboxylic acid is about 1 to about 6. Preferably, the pKa of the carboxylic acid is about 2 to about 6. More preferably, the pKa of the carboxylic acid is about 3.5 to about 5.

The carboxylic acid can be any suitable carboxylic acid having a pKa of about 1 to about 6. For example, the carboxylic acid can be selected from acetic acid, propionic acid, and butanoic acid. Preferably, the carboxylic acid is acetic acid.

The carboxylic acid can be present in the polishing composition at any suitable concentration. Preferably, the carboxylic acid is present in the polishing composition at a concentration of about 10 ppm to about 1000 ppm, e.g., about 10 ppm to about 500 ppm, about 10 ppm to about 250 ppm, about 25 ppm to about 750 ppm, about 25 ppm to about 500 ppm, about 25 ppm to about 250 ppm, about 30 ppm to about 250 ppm, about 35 ppm to about 350 ppm, about 50 ppm to about 425 ppm, about 55 ppm to about 400 ppm, or about 75 ppm to about 350 ppm. More preferably, the carboxylic acid is present in the polishing composition at a concentration of about 25 ppm to about 150 ppm, e.g., about 40 ppm, about 50 ppm, about 60 ppm, about 75 ppm, about 100 ppm, or about 125 ppm.

The pH of the polishing composition is about 1 to about 6. Typically, the polishing composition has a pH of about 3 or greater. Also, the pH of the polishing composition typically is about 6 or less. For example, the pH can be in the range of about 3.5 to about 6, e.g., a pH of about 3.5, a pH of about 4, a pH of about 4.5, a pH of about 5, a pH of about 5.5, a pH of about, 6, or a pH in a range defined by any two of these pH values. Desirably, the pH of the polishing composition is within about 2 units of the pKa of the carboxylic acid. As an example, if the pH of the polishing composition is about 3.5, the pKa of the carboxylic acid preferably is about 1.5 to about 5.5.

The pH of the polishing composition can be achieved and/or maintained by any suitable means. More specifically, the polishing composition can further comprise a pH adjustor, a pH buffering agent, or a combination thereof. Desirably, the polishing composition includes a pH-adjusting agent. The pH-adjusting agent can be any suitable pH-adjusting agent. For example, the pH-adjusting agent can be an alkyl amine, an alcohol amine, quaternary amine hydroxide, ammonia, or a combination thereof. For example, the pH-adjusting agent can be triethanolamine, tetramethylammonium hydroxide (TMAH or TMA-OH), or tetraethylammonium (TEAR or TEA-OH). Preferably, the pH-adjusting agent is triethanolamine.

The pH-adjusting agent can be present in the polishing composition in any suitable concentration. Desirably, the pH-adjusting agent is present in the polishing composition at a sufficient concentration to achieve and/or maintain the pH of the polishing composition within the pH ranges set forth herein, e.g., in the range of about 1 to about 6, or in the range of about 3.5 to about 5. For example, the pH-adjusting agent can be present in the polishing composition at a concentration of about 10 ppm to about 300 ppm, e.g., about 50 ppm to about 200 ppm, or about 100 ppm to about 150 ppm.

The polishing composition includes an aqueous carrier. The aqueous carrier contains water (e.g., deionized water) and may contain one or more water-miscible organic solvents. Examples of organic solvents that can be used include alcohols such as propenyl alcohol, isopropyl alcohol, ethanol, 1-propanol, methanol, 1-hexanol, and the like; aldehydes such as acetylaldehyde and the like; ketones such as acetone, diacetone alcohol, methyl ethyl ketone, and the like; esters such as ethyl formate, propyl formate, ethyl acetate, methyl acetate, methyl lactate, butyl lactate, ethyl lactate, and the like; ethers including sulfoxides such as dimethyl sulfoxide (DMSO), tetrahydrofuran, dioxane, diglyme, and the like; amides such as N,N-dimethylformamide, dimethylimidazolidinone, N-methylpyrrolidone, and the like; polyhydric alcohols and derivatives of the same such as ethylene glycol, glycerol, diethylene glycol, diethylene glycol monomethyl ether, and the like; and nitrogen-containing organic compounds such as acetonitrile, amylamine, isopropylamine, imidazole, dimethylamine, and the like. Preferably, the aqueous carrier is water alone, i.e., without the presence of an organic solvent.

The polishing composition also can comprise an additive selected from an anionic copolymer of a carboxylic acid monomer, a sulfonated monomer, or a phosphonated monomer, and an acrylate, a polyvinylpyrrolidone, or a polyvinylalcohol (e.g., a copolymer of 2-hydroxyethylmethacrylic acid and methacrylic acid); a nonionic polymer, wherein the nonionic polymer is polyvinylpyrrolidone or polyethylene glycol; a silane, wherein the silane is an amino silane, an ureido silane, or a glycidyl silane; an N-oxide of a functionalized pyridine (e.g., picolinic acid N-oxide); a starch; a cyclodextrin (e.g., alpha-cyclodextrin or beta-cyclodextrin), and combinations thereof.

When the additive is a nonionic polymer, and when the nonionic polymer is polyvinylpyrrolidone, the polyvinylpyrrolidone can have any suitable molecular weight. For example, the polyvinylpyrrolidone can have a molecular weight of about 10,000 g/mol to about 1,000,000 g/mol, e.g., about 20,000 g/mol, about 30,000 g/mol, about 40,000 g/mol, about 50,000 g/mol, or about 60,000 g/mol. When the additive is a nonionic polymer, and when the nonionic polymer is polyethylene glycol, the polyethylene glycol can have any suitable molecular weight. For example, the polyethylene glycol can have a molecular weight of about 200 g/mol to about 200,000 g/mol, about 8000 g/mol, about 100,000 g/mol.

When the additive is a silane, the silane can be any suitable amino silane, ureido silane, or glycidyl silane. For example, the silane can be 3-aminopropyltrimethoxysilane, 3-aminopropylsilanetriol, N-(2-aminoethyl)-3-aminopropyltrimethoxysilane, N-(2-aminoethyl)-3-aminopropyltrimethoxysilanetriol, (N,N-dimethyl-3-aminopropyltrimethoxysilane, N-phenyl-3-aminopropyltrimethoxysilane, ureidopropyltriethoxysilane, or 3-glycidopropyldimethylethoxysilane.

Preferably, when the polishing composition comprises an additive, the additive is selected from a copolymer of 2-hydroxyethylmethacrylic acid and methacrylic acid, polyvinylpyrrolidone, aminopropylsilanetriol, picolinic acid N-oxide, starch, alpha-cyclodextrin, beta-cyclodextrin, and combinations thereof.

The additive (i.e., the anionic copolymer of a carboxylic acid monomer, a sulfonated monomer, or a phosphonated monomer, and an acrylate, a polyvinylpyrrolidone, or a polyvinylalcohol; the silane; the N-oxide of a functionalized pyridine; the starch; the cyclodextrin; or a combination thereof, in total) can be present in the chemical-mechanical polishing composition at any suitable concentration. Preferably, the additive is present in the polishing composition at a concentration of about 1 ppm to about 500 ppm, e.g., about 5 ppm to about 400 ppm, about 10 ppm to about 400 ppm, about 15 ppm to about 400 ppm, about 20 ppm to about 400 ppm, about 25 ppm to about 400 ppm, about 10 ppm to about 300 ppm, about 10 ppm to about 250 ppm, about 30 ppm to about 350 ppm, about 30 ppm to about 275 ppm, about 50 ppm to about 350 ppm, or about 100 ppm to about 300 ppm. More preferably, the additive is present in the polishing composition at a concentration of about 1 ppm to about 300 ppm, e.g., about 1 ppm to about 275 ppm, about 1 ppm to about 250 ppm, about 1 ppm to about 100 ppm, about 1 ppm to about 50 ppm, about 10 ppm to about 250 ppm, about 10 ppm to about 100 ppm, or about 35 ppm to about 250 ppm.

The polishing composition optionally further comprises One or more other additives. The polishing composition can comprise a surfactant and/or rheological control agent, including viscosity enhancing agents and coagulants (e.g., polymeric rheological control agents, such as, for example, urethane polymers), a dispersant, as biocide (e.g., KATHON™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like.

The polishing composition can be prepared by any suitable technique, many of which are known to those skilled in the art. The polishing composition can be prepared in a batch or continuous process. Generally, the polishing composition can be prepared by combining the components herein in any order. The term "component" as used herein includes individual ingredients (e.g., first abrasive particles, functionalized heterocycle, cationic polymer, carboxylic acid, pH-adjusting agent, etc.) as well as any combination of ingredients (e.g., first abrasive particles, functionalized heterocycle, cationic polymer, carboxylic acid, pH-adjusting agent, etc.).

For example, the functionalized heterocycle, cationic polymer, and carboxylic acid (when included) can be added to water at the desired concentration(s). The pH can then be adjusted (as desired) and the first abrasive particles can be added to the mixture at the desired concentration to form the polishing composition. The polishing composition can be prepared prior to use, with one or more components added to the polishing composition just before use (e.g., within about 1 minute before use, or within about 1 hour before use, or within about 7 days before use). The polishing composition also can be prepared by mixing the components at the surface of the substrate during the polishing operation.

The polishing composition also can be provided as a concentrate which is intended to be diluted with an appropriate amount of the aqueous carrier, particularly water, prior to use. In such an embodiment, the polishing composition concentrate can comprise first abrasive particles, a functionalized heterocycle, a cationic polymer, a carboxylic acid (when included in the polishing composition), a pH-adjusting agent, and water, in amounts such that, upon dilution of the concentrate with an appropriate amount of water, each component of the polishing composition will be present in the polishing composition in an amount within the appropriate range recited above for each component. Furthermore, as will be understood by those of ordinary skill in the art, the concentrate can contain an appropriate fraction of the water present in the final polishing composition in order to ensure that other components are at least partially or fully dissolved in the concentrate.

While the polishing composition can be prepared well before, or even shortly before, use, the polishing, composition also can be produced by mixing the components of the polishing, composition at or near the point-of-use. As utilized herein, the term "point-of-use" refers to the point at which the polishing composition is applied to the substrate surface (e.g., the polishing pad or the substrate surface itself). When the polishing composition is to be produced using point-of-use mixing, the components of the polishing composition are separately stored in two or more storage devices.

In order to mix components contained in storage devices to produce the polishing composition at or near the point-of-use, the storage devices typically are provided with one or more flow lines leading from each storage device to the point-of-use of the polishing composition (e.g., the platen, the polishing pad, or the substrate surface). By the term "flow line" is meant a path of flow from an individual storage container to the point-of-use of the component stored therein. The one or more flow lines can each lead directly to the point-of-use, or, in the situation where more than one flow line is used, two or more of the flow lines can be combined at any point into a single flow line that leads to the point-of-use. Furthermore, any of the one or more flow lines (e.g., the individual flow lines or a combined flow line) can first lead to one or more of the other devices (e.g., pumping device, measuring, device, mixing device, etc.) prior to reaching the point-of-use of the component(s).

The components of the polishing composition can be delivered to the point-of-use independently (e.g., the components are delivered to the substrate surface whereupon the components are nixed during the polishing process), or the components can be combined immediately before delivery to the point-of-use. Components are combined "immediately before delivery to the point-of-use" if they are combined less than 10 seconds prior to reaching the point-of-use, preferably less than 5 seconds prior to reaching the point-of-use, more preferably less than 1 second prior to reaching the point of use, or even simultaneous to the delivery of the components at the point-of-use (e.g., the components are combined at a dispenser). Components also are combined "immediately before delivery to the point-of-use" if they are combined within 5 m of the point-of-use, such as within 1 m of the point-of-use or even within 10 cm of the point-of-use (e.g., within 1 cm of the point of use).

When two or more of the components of the polishing composition are combined prior to reaching the point-of-use, the components can be combined in the flow line and delivered to the point-of-use without the use of a mixing device. Alternatively, one or more of the flow lines can lead into a mixing device to facilitate the combination of two or more of the components. Any suitable mixing device can be used. For example, the mixing device can be a nozzle or jet (e.g., a high pressure nozzle or jet) through which two or more of the components flow. Alternatively, the mixing device can be a container-type mixing device comprising one or more inlets by which two or more components of the polishing composition are introduced to the mixer, and at least one outlet through which the mixed components exit the mixer to be delivered to the point-of-use, either directly or via other elements of the apparatus (e.g., via one or more flow lines). Furthermore, the mixing device can comprise more than one chamber, each chamber having at least one inlet and at least one outlet, wherein two or more components are combined in each chamber. If a container-type mixing device is used, the mixing, device preferably comprises a mixing mechanism to further facilitate the combination of the components. Mixing mechanisms are generally known in the art and include stirrers, blenders, agitators, paddled baffles, gas sparger systems, vibrators, etc.

The invention also provides a method of polishing a substrate with the polishing composition described herein. The method of polishing a substrate comprises (i) providing a substrate; (ii) providing, a polishing pad; (iii) providing, the aforementioned chemical-mechanical polishing composition; (iv) contacting the substrate with the polishing pad and the chemical-mechanical polishing composition; and (v) moving the polishing pad and the chemical-mechanical polishing composition relative to the substrate to abrade at least a portion of the substrate to polish the substrate.

In addition, the invention provides a method of polishing a substrate comprising (i) providing a substrate, wherein the substrate comprises a silicon oxide layer; (ii) providing at polishing pad; (iii) providing the aforementioned chemical-mechanical polishing composition; (iv) contacting the substrate with the polishing pad and the chemical mechanical polishing composition; and (v) moving the polishing pad and the chemical-mechanical polishing composition relative to the substrate to abrade at least a portion of the silicon oxide layer on a surface of the substrate to polish the substrate.

More specifically, the invention further provides a method of polishing a substrate comprising (i) providing a substrate, wherein the substrate comprises a silicon oxide layer; (ii) providing a polishing pad; (iii) providing a chemical-mechanical polishing composition comprising: (a) first abrasive particles, wherein the first abrasive particles are wet-process ceria particles, have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer, wherein the cationic polymer is a quaternary amine, and wherein the cationic polymer is present in the polishing composition at a concentration of about 1 ppm to about 250 ppm, (d) a carboxylic acid, wherein the pKa of the carboxylic acid is about 1 to about 6, and wherein the carboxylic acid is present in the polishing composition at a concentration of about 25 ppm to about 500 ppm, (e) a pH-adjusting agent, and (f) an aqueous carrier, therein the pH of the polishing composition is about 1 to about 6, and wherein the pH of the polishing composition is within about 2 units of the pKa of the carboxylic acid; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

The invention also provides a method of polishing a substrate comprising (i) providing a substrate, wherein the substrate comprises a silicon oxide layer; (ii) providing a polishing pad; (iii) providing a chemical-mechanical polishing composition comprising: (a) first abrasive particles, wherein the first abrasive particles are wet-process ceria particles, have a median particle size of about 75 nm to about 200 nm, and are present in the polishing composition at a concentration of about 0.005 wt. % to about 2 wt. %, (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer selected from a cationic polyvinyl alcohol and a cationic cellulose, wherein the cationic polymer is present in the polishing composition at a concentration of about 1 ppm to about 250 ppm, (d) a pH-adjusting agent, and (e) an aqueous carrier, wherein the pH of the polishing composition is about 1 to about 6; (iv) contacting the substrate with the polishing pad and the chemical-mechanical polishing composition; and (v) moving the polishing pad and the chemical-mechanical polishing composition relative to the substrate to abrade at least a portion of the silicon oxide layer on a surface of the substrate to polish the substrate.

The polishing compositions of the invention are useful for polishing any suitable substrate. The polishing compositions are particularly useful in the polishing of a substrate comprising a silicon oxide layer. Suitable substrates include, but are not limited to, flat panel displays, integrated circuits, memory or rigid disks, metals, semiconductors, inter-layer dielectric (ILD) devices, microelectromechanical systems (MEMS), ferroelectrics, and magnetic heads. The polishing composition is particularly well-suited for planarizing or polishing a substrate that has undergone shallow trench isolation (STI) processing. The substrate can further comprise at least one other layer, e.g., an insulating layer. The insulating, layer can be a metal oxide, porous metal oxide, glass, organic polymer, fluorinated organic polymer, or any other suitable high or low-K insulating layer. The insulating layer can comprise, consist essentially of, or consist of silicon oxide, silicon nitride, or combinations thereof. The silicon oxide layer can comprise, consist essentially of, or consist of any suitable silicon oxide, many of which are known in the art. For example, the silicon oxide layer can comprise tetraethoxysilane (MOS), high density plasma (HDP) oxide, borophosphosilicate glass (BPSG), high aspect ratio process (HARP) oxide, spin on dielectric (SOD) oxide, chemical vapor deposition (CVD) oxide, plasma-enhanced tetraethyl ortho silicate (PETEOS), thermal oxide, or undoped silicate glass. The substrate can further comprise a metal layer. The metal can comprise consist essentially of, or consist of any suitable metal, ninny of which are known in the art, such as, for example, copper, tantalum, tungsten, titanium, platinum, ruthenium, iridium, aluminum, nickel, or combinations thereof.

In accordance with the invention, a substrate can be planarized or polished with the polishing composition described, herein by any suitable technique. The polishing method of the invention is particularly suited for use in conjunction with a chemical-mechanical polishing (CMP) apparatus. Typically, the CMP apparatus comprises a platen, which, when in use, is in motion and has a velocity that results from orbital, linear, or circular motion, a polishing pad in contact with the platen and moving with the platen when in motion, and a carrier that holds a substrate to be polished by contacting and moving relative to the surface of the polishing pad. The polishing of the substrate takes place by the substrate being placed in contact with a polishing composition of the invention and typically a polishing pad and then abrading at least a portion of the surface of the substrate, e.g., the silicon oxide, or one or more of the substrate materials described, herein, with the polishing composition and typically the polishing pad to polish the substrate. Any suitable polishing conditions can be used to polish a substrate according to the invention.

A substrate can be planarized or polished with the chemical-mechanical polishing composition in conjunction with any suitable polishing pad (e.g., polishing surface). Suitable polishing pads include, for example, woven and non-woven polishing pads. Moreover, suitable polishing pads can comprise any suitable polymer of varying density, hardness, thickness, compressibility, ability to rebound upon compression, and compression modulus. Suitable polymers include, for example, polyvinylchloride, polyvinylfluoride nylon, fluorocarbon, polycarbonate, polyester, polyacrylate, polyether, polyethylene, polyamide, polyurethane, polystyrene, polypropylene, coformed products thereof, and mixtures thereof.

Desirably, the CMP apparatus further comprises an in situ polishing endpoint detection system, many of which are known in the art. Techniques for inspecting and monitoring the polishing process by analyzing light or other radiation reflected from a surface of the workpiece are known in the art. Such methods are described, for example, in U.S. Pat. No. 5,196,353, U.S. Pat. No. 5,433,651, U.S. Pat. No. 5,609,511, U.S. Pat. No. 5,643,046, U.S. Pat. No. 5,658,183, U.S. Pat. No. 5,730,642, U.S. Pat. No. 5,838,447, U.S. Pat. No. 5,872,633, U.S. Pat. No. 5,893,796, U.S. Pat. No. 5,949,927, and U.S. Pat. No. 5,964,643. Desirably, the inspection or monitoring of the progress of the polishing process with respect to a workpiece being polished enables the determination of the polishing end-point, i.e. the determination of when to terminate the polishing process with respect to a particular workpiece.

Embodiments (1) In embodiment (1) is presented a chemical-mechanical polishing composition comprising:
(a) first abrasive particles, wherein the first abrasive particles are wet-process ceria particles, have a median particle size of about 75 nm to about 200 nm, and are present in the polishing composition at a concentration of about 0.005 to about 2 wt. %.
(b) functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm,
(c) a cationic polymer, wherein the cationic polymer is a quaternary amine, and wherein the cationic polymer is present in the polishing composition at a concentration of about 1 ppm to about 250 ppm,
(d) a carboxylic acid, wherein the pKa of the carboxylic acid is about 1 to about 6, and wherein the carboxylic acid is present in the polishing composition at a concentration of about 25 ppm to about 500 ppm,
(e) a pH-adjusting agent, and
(f) an aqueous carrier,
wherein the pH of the polishing composition is about 1 to about 6, and wherein the pH of the polishing composition is within about 2 units of the pKa of the carboxylic acid.

(2) In embodiment (2) is presented the chemical-mechanical polishing composition of embodiment (1), wherein the first abrasive particles are present in the polishing composition at a concentration of about 0.1 wt. % to about 0.5 wt. %.

(3) in embodiment (3) is presented the chemical-mechanical polishing composition of embodiment (1) or (2), wherein the polishing composition further comprises second abrasive particles, and wherein the second abrasive particles are wet-process ceria particles, have a median particle size of about 1 nm to about 60 nm, and are present in the polishing composition at a concentration of about 0.005 wt. % to about 2 wt. %.

(4) In embodiment (4) is presented the chemical-mechanical polishing composition of embodiment (3), wherein the first abrasive particles and the second abrasive particles, in total, are present in the polishing composition at a concentration of about 0.1 wt. % to about 0.5 wt. %.

(5) In embodiment (5) is presented the chemical-mechanical polishing composition of any one of embodiments (1)-(4), wherein the functionalized heterocycle comprises a functionalized nitrogen-containing heterocycle, and wherein the functionalized nitrogen-containing heterocycle is picolinic acid.

(6) In embodiment (6) is presented the chemical-mechanical polishing composition of any one of embodiments (1)-(4), wherein the functionalized heterocycle comprises a functionalized nitrogen-containing heterocycle, and wherein the functionalized nitrogen-containing heterocycle is quinaldic acid.

(7) in embodiment (7) is presented the chemical-mechanical polishing composition of any one of embodiments (1)-(6), wherein the cationic polymer is poly(vinylimidazolium).

(8) In embodiment (8) is presented the chemical-mechanical polishing composition of embodiment (7), wherein the poly(vinylimidazolium) is present in the polishing composition at a concentration of about 1 ppm to about 5 ppm.

(9) in embodiment (9) is presented the chemical-mechanical polishing composition of any one of embodiments (1)-(8), wherein the pKa of the carboxylic acid is about 3.5 to about 5.

(10) In embodiment (10) is presented the chemical-mechanical polishing composition of embodiment (9), wherein the carboxylic acid is acetic acid.

(11) In embodiment (11) is presented the chemical-mechanical polishing composition of any one of embodiments (1)-(10), wherein the pH-adjusting agent is selected from an alkyl amine, an alcohol amine, a quaternary amine hydroxide, ammonia, and combinations thereof.

(12) In embodiment (12) is presented the chemical-mechanical polishing composition of embodiment (11), wherein the pH-adjusting agent triethanolamine.

(13) In embodiment (13) is presented the chemical-mechanical polishing composition of any one of embodiments (1)-(12), wherein the pH of the polishing composition is about 3.5 to about 5.

(14) in embodiment (14) is presented a chemical-mechanical polishing composition comprising:

(a) first abrasive particles, wherein the first abrasive particles are wet-process ceria particles, have a median particle size of about 75 nm to about 200 nm, and are present in the polishing, composition at a concentration of about 0.005 wt. % to about 2 wt. %, (b) a functionalized heterocycle selected from functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer selected from a cationic polyvinyl alcohol and a cationic cellulose, wherein the cationic polymer is present in the polishing composition at a concentration of about 1 ppm to about 250 ppm.

(d) a pH-adjusting agent, and (e) an aqueous carrier, wherein the pH of the polishing composition is about 1 to about 6.

(15) In embodiment (15) is presented the chemical-mechanical polishing composition of embodiment (14), wherein the first abrasive particles are present in the polishing composition at a concentration of about 0.1 wt. % to about 0.5 wt. %.

(16) in embodiment (16) is presented the chemical-mechanical polishing composition of embodiment (14) or (15), wherein the polishing composition further comprises second abrasive particles, and wherein the second abrasive particles are wet-process ceria particles, have a median particle size of about 1 nm to about 60 nm, and are present in the polishing composition at a concentration of about 0.005 wt. % to about 2 wt. %.

(17) In embodiment (17) is presented the chemical-mechanical polishing composition of embodiment (16), wherein the first abrasive particles and the second abrasive particles, in total, are present in the polishing composition at a concentration of about 0.1 wt. % to about 0.5 wt. %.

(18) In embodiment (18) is presented the chemical-mechanical polishing composition of any one of embodiments (14)-(17), wherein the functionalized heterocycle comprises a functionalized nitrogen-containing heterocycle, and wherein the functionalized nitrogen-containing heterocycle is picolinic acid.

(19) in embodiment (19) is presented the chemical-mechanical polishing, composition of any one of embodiments (14)-(17), wherein the functionalized heterocycle comprises a functionalized nitrogen-containing heterocycle, and wherein the functionalized nitrogen-containing heterocycle is quinaldic acid.

(20) In embodiment (20) is presented the chemical-mechanical polishing composition of any one of embodiments (14)-(19), wherein the cationic polymer is a cationic polyvinyl alcohol.

(21) In embodiment (21) is presented the chemical-mechanical polishing composition of embodiment (20), wherein the cationic polyvinyl alcohol is present in the polishing composition at a concentration of about 1 ppm to about 40 ppm.

(22) In embodiment (22) is presented the chemical-mechanical polishing composition of any one of embodiments (14)-(21), wherein the polishing composition further comprises a carboxylic acid, wherein the pKa of the carboxylic acid is about 1 to about 6, and wherein the carboxylic acid is present in the polishing composition at a concentration of about 25 ppm to about 500 ppm.

(23) In embodiment (23) is presented the chemical-mechanical polishing composition of embodiment (22), wherein the pKa of the carboxylic acid is about 3.5 to about 5.

(24) In embodiment (24) is presented the chemical-mechanical polishing composition of embodiment (22) or (23), wherein the carboxylic acid is acetic acid.

(2.5) in embodiment (25) is presented the chemical-mechanical polishing composition of any one of embodiments (14)-(24), wherein the pH-adjusting agent is selected from an alkyl amine, an alcohol amine, a quaternary amine hydroxide, ammonia, and combinations thereof.

(26) In embodiment (26) is presented the chemical-mechanical polishing composition of embodiment (25), wherein the pH-adjusting agent is triethanolamine.

(27) In embodiment (27) is presented the chemical-mechanical polishing composition of any one of embodiments (14)-(26), wherein the pH of the polishing composition is about 3.5 to about 5.

(28) In embodiment (28) is presented a method of polishing a substrate comprising:

(i) providing a substrate;

(ii) providing a polishing pad;

(iii) providing the chemical-mechanical polishing composition of any one of embodiments (1)-(27);

(iv) contacting the substrate with the polishing, pad and the chemical-mechanical polishing composition; and (v) moving the polishing pad and the chemical-mechanical polishing composition relative to the substrate to abrade at least a portion of the substrate to polish the substrate.

(29) In embodiment (29) is presented a method of polishing a substrate comprising:
(i) providing a substrate, wherein the substrate comprises a silicon oxide layer;
(ii) providing a polishing pad;
(iii) providing the chemical-mechanical polishing composition of any one of embodiments (1)-(27);
(iv) contacting the substrate with the polishing pad and the chemical-mechanical polishing composition; and
(v) moving the polishing pad and the chemical-mechanical polishing composition relative to the substrate to abrade at least a portion of the silicon oxide layer on a surface of the substrate to polish the substrate.

EXAMPLES

The following examples further illustrate the invention but, of course, should not be construed as in any way limiting its scope.

Example 1

This example demonstrates the effect of a cationic polymer that is a quaternary amine on the removal rate of silicon oxide.

Tetraethoxysilane (TEOS) blanket wafers were polished with four polishing compositions (i.e., Polishing Compositions 1A-1D). Each of Polishing Compositions 1A-1D contained 0.2 wt. % wet-process ceria particles, 500 ppm picolinic acid, and water, and was pH-adjusted to pH 4.0 using triethanolamine. In particular, each of Polishing Compositions 1A-1D contained 0.1 wt. % wet-process ceria particles having a median particle size of about 103 nm (i.e., first abrasive particles), and 0.1 wt. % wet-process ceria particles having as median particle size of about 54 nm (i.e., second abrasive particles). Each of Polishing Compositions 1B-1D also contained poly(vinylimidazolium) in the amount listed in Table 1.

The TEOS blanket wafers were polished with Polishing Compositions 1A-1D under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket TEOS were determined in Å/min. The results are summarized, in Table 1.

TABLE 1

Blanket Silicon Oxide Removal Rates as a Function of Cationic Polymer

| Polishing Composition | Amount of Cationic Polymer (ppm) | TEOS Removal Rate (Å/min) |
|---|---|---|
| 1A (comparative) | 0 | 6242 |
| 1B (comparative) | 2 | 116 |
| 1C (comparative) | 4 | 98 |
| 1D (comparative) | 8 | 112 |

These results demonstrate that even a small amount of cationic polymer that is a quaternary amine, i.e., poly(vinylimidazolium), strongly binds to the surface of the TEOS wafer, protecting the surface of the wafer and suppressing the removal rate. These results further demonstrate the necessity of an additional additive to modulate the impact of the cationic polymer, i.e., to increase the removal rate of silicon oxide, without negating the protective effects of the cationic polymer.

Example 2

This example demonstrates the effectiveness of a polishing composition including a cationic polymer that is a quaternary amine and a carboxylic acid having a pKa of about 1 to about 6, wherein the pH of the polishing composition is within about 2 units of the pKa of the carboxylic acid.

Tetraethoxysilane (TEOS) blanket wafers were polished with four polishing compositions (i.e., Polishing Compositions 2A-2D). Each of Polishing Compositions 2A-2D contained 0.285 wt. % wet-process ceria particles, 715 ppm picolinic acid, and water, and was pH-adjusted to pH 4.0 using triethanolamine. In particular, each of Polishing Compositions 2A-2D contained 0.14 wt. % wet-process ceria particles having a median particle size of about 103 nm (i.e., first abrasive particles), and 0.14 wt. % wet-process ceria particles having a median particle size of about 54 nm (i.e., second abrasive particles). Each of Polishing Compositions 2B-2D also contained 1 ppm poly(vinylimidazolium) and acetic acid in the amounts listed in Table 2.

The TEOS blanket wafers were polished with Polishing Compositions 2A-2D under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket TEOS were determined in Å/min. The results are summarized in Table 2.

TABLE 2

Silicon Oxide Removal Rates as a Function of Cationic Polymer and Carboxylic Acid

| Polishing Composition | Amount of Cationic Polymer (ppm) | Amount of Carboxylic Acid (ppm) | TEOS Removal Rate (Å/min) |
|---|---|---|---|
| 2A (comparative) | 0 | 0 | 5556 |
| 2B (inventive) | 1 | 50 | 5359 |
| 2C (inventive) | 1 | 100 | 5242 |
| 2D (inventive) | 1 | 500 | 4853 |

These results demonstrate that the addition of a carboxylic acid having a pKa that is about 1 to 6 and that also is within about 2 units of the of the polishing composition, i.e., acetic acid, to a polishing composition including a cationic polymer, i.e., poly(vinylimidazolium), provides high silicon oxide removal rates. In particular, each of Polishing Compositions 2B-2D provided significantly higher blanket TEOS removal rates than the blanket TEOS removal rates provided by Polishing Compositions 1A-1D, which did not contain acetic acid. In addition, each of Polishing Compositions 2B-2D provided a blanket TEOS removal rate that was comparable to the blanket TEOS removal rate provided by Polishing Composition 2A. Thus, these results demonstrate that a carboxylic acid having a pKa of about 1 to about 6, and which is within about 2 units of the pH of the polishing composition, modulates the impact of the cationic polymer to provide a high removal rate for silicon oxide.

Example 3

This example demonstrates the effectiveness of a polishing composition including a cationic polymer that is a quaternary amine and a carboxylic acid having a pKa of about 1 to about 6, wherein the pH of the polishing composition is within about 2 units of the pKa of the carboxylic acid.

Tetraethoxysilane (TEOS) blanket wafers were polished with six polishing compositions (i.e., Polishing Compositions 3A-3F). Each of Polishing Compositions 3A-3F contained 0.285 wt. % wet-process ceria particles, 715 ppm picolinic acid, and water, and was pH-adjusted to pH 4.0 using triethanolamine. In particular, each of Polishing Compositions 3A-3F contained 0.14 wt. % wet-process ceria particles having a median particle size of about 103 nm (i.e., First abrasive particles), and 0.14 wt. % wet-process ceria particles having a median particle size of about 54 nm (i.e., second abrasive particles). Each of Polishing Compositions 3B-3F also contained poly(vinylimidazolium) and acetic acid in the amounts listed in Table 3.

TEOS pattern wafers also were polished for 60 seconds with Polishing Compositions 3A-3F. The TEOS pattern wafers had a 500 nm feature size with 50% density. The TEOS blanket wafers and the TEOS pattern wafers were polished with Polishing Compositions 3A-3F under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rates of the blanket and pattern TEOS (Å/min.) and trench loss (Å) were determined. The results are summarized in Table 3.

TABLE 3

Blanket and Pattern Silicon Oxide Removal Rates and Trench Loss as a Function of Cationic Polymer and Carboxylic Acid

| Polishing Composition | Amount of Cationic Polymer (ppm) | Amount of Carboxylic Acid (ppm) | Blanket TEOS Removal Rate (Å/min) | Pattern TEOS Removal Rate (Å/min) | Trench Loss (Å) |
|---|---|---|---|---|---|
| 3A (comparative) | 0 | 0 | 5549 | 9087 | 1768 |
| 3B (inventive) | 1 | 50 | 5396 | 8017 | 523 |
| 3C (inventive) | 1 | 100 | 5468 | 8229 | 640 |
| 3D (inventive) | 5 | 50 | 1971 | 4650 | 0 |
| 3E (inventive) | 5 | 100 | 1776 | 4227 | 0 |
| 3F (inventive) | 3 | 75 | 3990 | 7386 | 113 |

These results demonstrate that polishing compositions including relatively small amounts of a cationic polymer that is a quaternary amine, i.e., poly(vinylimidazolium), and a carboxylic acid, i.e., acetic acid, provide high blanket and pattern TEOS removal rates (see Polishing Compositions 3B-3F). These results farther demonstrate that the addition of even a small amount of a cationic polymer, poly(vinylimidazolium), provides a significant improvement in trench loss. In particular, Polishing Compositions 3B and 3C provided blanket and pattern TEOS removal rates that were only slightly lower than the removal rates provided by Polishing Composition 3A, but Polishing Compositions 3B and 3C exhibited a substantial improvement in trench loss compared to Polishing Composition 3A. Similarly, Polishing Composition 3F provided effective blanket and pattern TEOS removal rates, and exhibited a substantial improvement in trench loss compared to Polishing Composition 3A. Thus, these results demonstrate that a combination of a cationic polymer, i.e., poly(vinylimidazolium), and a carboxylic acid, i.e., acetic acid, provides an effective silicon oxide removal rate without negating the protective effects of the cationic polymer.

These results further demonstrate the "self-stopping" properties of Polishing Compositions 3D and 3E, which provided high pattern TEOS removal rates, but which also provided lower blanket TEOS removal rates as compared to Polishing Composition 3A. Thus, Polishing Compositions 3D and 3E first polish the pattern TEOS at a high removal rate, and upon reaching the blanket TEOS, exhibit a reduced removal rate, thereby preventing undesirable trench loss. As illustrated by Table 3, each of Polishing Compositions 3D and 3E exhibited significantly lower trench loss than that of Polishing Composition 3A. Indeed, Polishing Compositions 3D and 3E did not exhibit any measurable trench loss.

Example 4

This example demonstrates the effectiveness of a polishing composition including a cationic polymer that is a quaternary amine and a carboxylic acid having a pKa of about 1 to about 6, wherein the pH of the polishing composition is within about 2 units of the pKa of the carboxylic acid.

Tetraethoxysilane (TEOS) pattern wafers were polished with six polishing compositions (i.e., Polishing Compositions 4A-4F). The TEOS pattern wafers had a 500 μm feature size with 50% density. Each of Polishing Compositions 4A-4F contained 0.285 wt. % wet-process ceria particles, 715 ppm picolinic acid, and water, and was pH-adjusted to pH 4.0 using triethanolamine. In particular, each of Polishing Compositions 4A-4F contained 0.14 wt. % wet-process ceria particles having a median particle size of about 103 nm (i.e., first abrasive particles), and 0.14 wt. % wet-process ceria particles having a median particle size of about 54 nm (i.e., second abrasive particles). Each of Polishing Compositions 4B-4F also contained poly(vinylimidazolium) and acetic, acid in the amounts listed in Table 4.

The TEOS pattern wafers were polished with Polishing Compositions 4A-4F under the same polishing conditions. In particular, the wafers were polished on a Reflexion™ polisher (Applied Materials) with an IC 1010™ pad (Dow Chemical). The polishing parameters were as follows: 20.68 kPa (3 psi) downforce, 93 rpm platen speed, 87 rpm head speed, and 250 mL/min polishing flow. The remaining TEOS step height (Å) and trench loss (Å) were determined after 0 seconds of polishing, ("0 s"), alter 50 seconds of polishing ("50 s"), and after 75 seconds of polishing ("75 s"). The results are summarized in Table 4.

TABLE 4

Remaining Silicon Oxide Step Height and Trench Loss as a Function of Cationic Polymer and Carboxylic Acid

| Polishing Composition | Amount of Cationic Polymer (ppm) | Amount of Carboxylic Acid (ppm) | Trench Loss (Å) | | | Remaining TEOS Step Height (Å) | | |
|---|---|---|---|---|---|---|---|---|
| | | | 0 s | 50 s | 75 s | 0 s | 50 s | 75 s |
| 4A (comparative) | 0 | 0 | 0 | 1290 | 4058 | 8033 | 1004 | −79 |
| 4B (inventive) | 1 | 50 | 0 | 1141 | 4003 | 8032 | 894 | −139 |
| 4C (inventive) | 5 | 50 | 0 | 84 | 159 | 8032 | 5934 | 4488 |
| 4D (inventive) | 1 | 100 | 0 | 1087 | 3900 | 8033 | 943 | −127 |
| 4E (inventive) | 5 | 100 | 0 | 580 | 2365 | 8032 | 1734 | 53 |
| 4F (inventive) | 3 | 75 | 0 | 946 | 3650 | 8032 | 1120 | −72 |

FIG. 1 and Table 4 illustrate the relationship between the trench loss (Å) and remaining step height (Å) for Polishing Compositions 4A-4F. In particular, FIG. 1 illustrates the remaining step height (Å) versus trench loss (Å) for Polishing Compositions 4B-4F, which include a cationic polymer and a carboxylic acid, as well as for Polishing Composition 4A, which does not include a cationic polymer or a carboxylic acid. As shown in FIG. 1, Polishing Compositions 4B-4F exhibited lower trench loss as polishing, progressed and as the remaining step height was reduced. In addition, at a comparable step height, Polishing Compositions 4B-4F showed improved trench loss as compared to Polishing Composition 4A. Thus, these results demonstrate that Polishing Compositions 4B-4F provide an improvement in planarization efficiency as compared to Polishing Composition 4A.

Example 5

This example demonstrates the effectiveness of a polishing composition including a cationic polymer that is a quaternary amine and a carboxylic acid having a pKa of about 1 to about 6, wherein the pH of the polishing composition is within about 2 units of the pKa of the carboxylic acid.

Tetraethoxysilane (TEOS) blanket wafers were polished with five polishing compositions (i.e., Polishing Compositions 5A-5E). Each of Polishing Compositions 5A-5E contained 0.285 wt. % wet-process ceria particles and water, and was pH-adjusted to pH 4.0 using triethanolamine. In particular, each of Polishing Compositions 5A-5E contained 0.14 wt. % wet-process ceria particles having a median particle size of about 103 nm (i.e., first abrasive particles), and 0.14 wt. % wet-process ceria particles having a median particle size of about 54 nm (i.e., second abrasive particles). Each polishing composition also contained picolinic acid or quinaldic acid in the amounts listed in Table 5. Some of the polishing compositions also contained poly(vinylimidazolium) and/or acetic acid in the amounts listed in Table 5.

TEOS pattern wafers also were polished with Polishing Compositions 5A-5E, The TEOS pattern wafers had a 500 μm feature size with 50% density. The TEOS blanket wafers and the TEOS pattern wafers were polished with Polishing compositions 5A-5E under the same polishing conditions. In particular, the wafers were polished on a Reflexion™ polisher (Applied Materials) with an IC 1010™ pad (Dow Chemical). The polishing parameters were as follows: 20.68 kPa (3 psi) downforce, 93 rpm platen speed, 87 rpm head speed, and 250 mL/min polishing flow. Following polishing, the removal rates of the blanket TEOS were determined in Å/min. The results are summarized in Table 5.

In addition, the remaining TEOS step height (Å) and trench loss (Å) were determined after 0 seconds of polishing ("0 s"), after 45 seconds of polishing ("45 s"), and after 55 seconds of polishing ("55 s"). The results are summarized in Table 6.

TABLE 5

Blanket Silicon Oxide Removal Rate as a Function of Functionalized Heterocycle, Cationic Polymer, and Carboxylic Acid

| Polishing Composition | Amount of Picolinic Acid (ppm) | Amount of Quinaldic Acid (ppm) | Amount of Poly(vinyl-imidazolium) (ppm) | Amount of Acetic Acid (ppm) | Blanket TEOS Removal Rate (Å/min) |
|---|---|---|---|---|---|
| 5A (comparative) | 715 | 0 | 0 | 0 | 7383 |
| 5B (comparative) | 0 | 750 | 0 | 100 | 1186 |
| 5C (comparative) | 0 | 500 | 0 | 100 | 1611 |
| 5D (inventive) | 0 | 750 | 8 | 100 | 433 |
| 5E (inventive) | 0 | 500 | 8 | 100 | 516 |

TABLE 6

Pattern Silicon Oxide Removal Rates, Remaining Silicon Oxide Step Height, and Trench Loss as a Function of Functionalized Heterocycle, Cationic Polymer, and Carboxylic Acid

| Polishing Composition | Trench Loss (Å) | | | Remaining TEOS Step Height (Å) | | |
|---|---|---|---|---|---|---|
| | 0 s | 45 s | 55 s | 0 s | 45 s | 55 s |
| 5A (comparative) | 0 | 865 | 1661 | 8033 | 1313 | 656 |
| 5B (comparative) | 0 | 945 | — | 8032 | 1284 | — |
| 5C (comparative) | 0 | 869 | — | 8032 | 1245 | — |
| 5D (inventive) | 0 | 121 | 174 | 8033 | 4877 | 3882 |
| 5E (inventive) | 0 | 137 | — | 8032 | 4623 | — |

Figure 2:
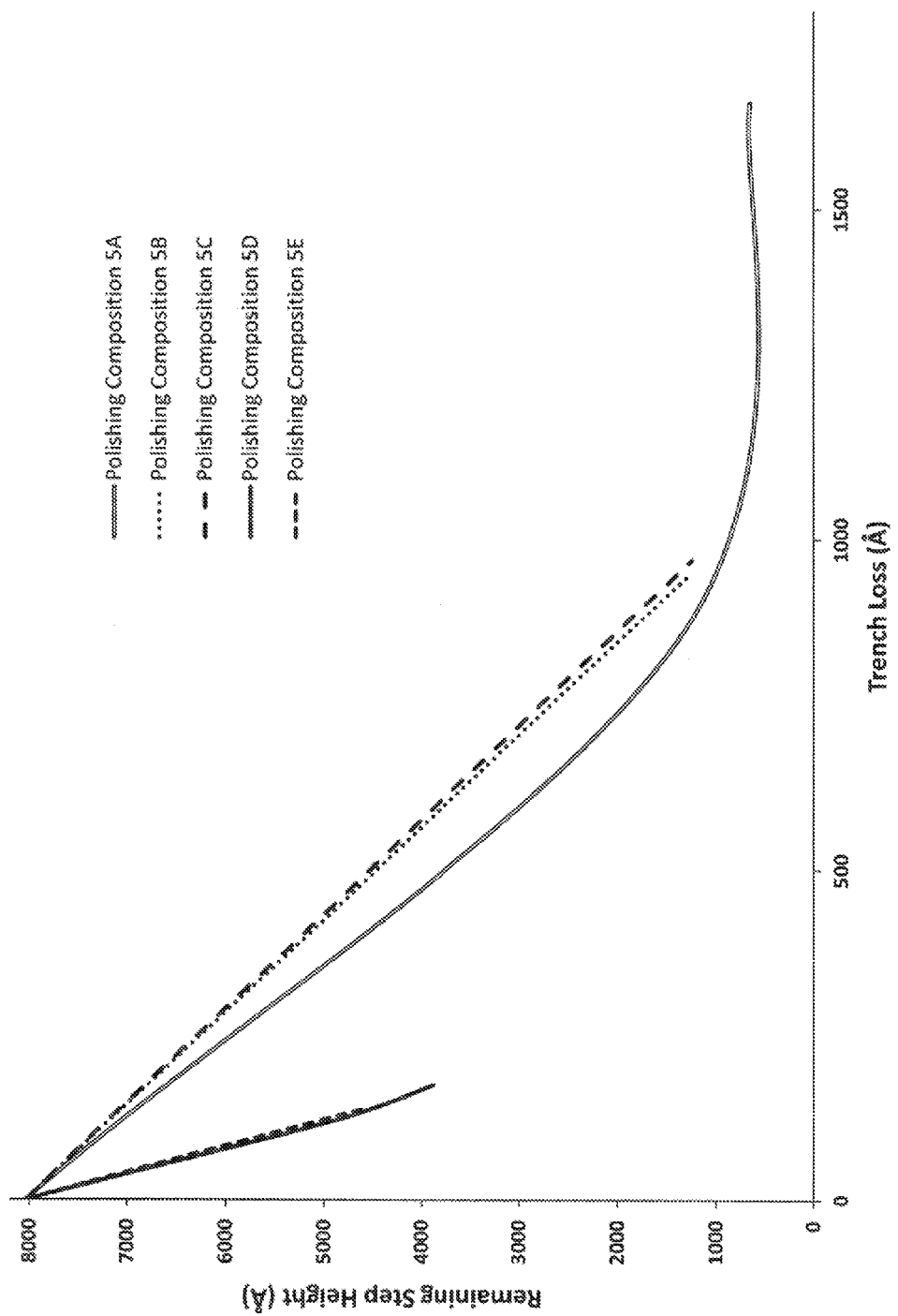

FIG. 2 and Table 6 illustrate the relationship between the trench loss (Å) and remaining step height (Å) for Polishing Compositions 5A-5E. In particular, as illustrated by FIG. 2, Polishing Compositions 5D and 5F, exhibited significantly lower trench loss as polishing progressed and as the remaining step height was reduced, as compared to Polishing Compositions 5A-5C. In addition, at a comparable step height, Polishing Compositions 5D and 5E showed improved trench loss as compared to Polishing Compositions 5A-5C. Thus, these results demonstrate that Polishing Compositions 5D and 5E provide an improvement in planarization efficiency as compared to Polishing Compositions 5A-5C.

Figure 3:
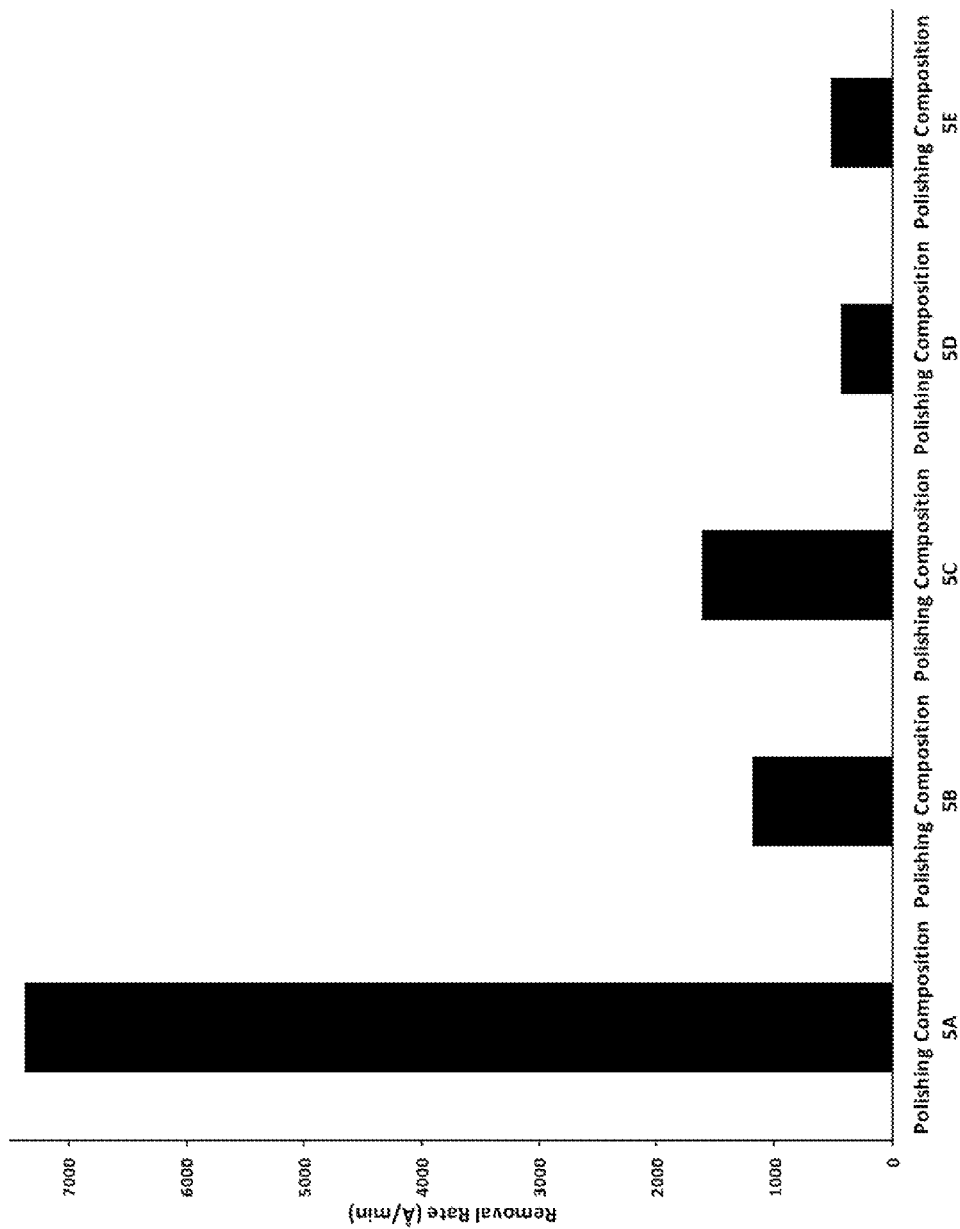

FIG. 3 and Table 5 illustrate the blanket TEOS removal rate (Å/min.) for Polishing Compositions 5A-5E. In particular, FIG. 3 illustrates that Polishing Compositions 5D and 5E exhibited lower blanket TEOS removal rates than the blanket TEOS removal rates provided by Polishing Compositions 5A-5C. Thus, FIGS. 2 and 3 demonstrate the "self-stopping" properties of Polishing Compositions 5D and 5E, which provide improved planarization efficiency as compared to Polishing Compositions 5A-5C, but which also exhibit lower blanket TEOS removal rates as compared to Polishing Compositions 5A-5C. In other words, Polishing Compositions 5D and 5E first efficiently polish pattern TEOS and upon reaching, blanket TEOS, exhibit a reduced removal rate, thereby preventing undesirable trench loss. As illustrated by Table 6, each of Polishing Compositions 5D and 5E exhibited lower trench loss than that of Polishing Compositions 5A-5C.

Example 6

This example demonstrates the effectiveness of a polishing composition including a cationic polymer selected from a cationic polyvinyl alcohol and a cationic cellulose.

Tetraethoxysilane (TEOS) pattern wafers were polished with four polishing compositions (i.e., Polishing Compositions 6A-6D). The TEOS pattern wafers had a 500 μm feature size with 50% density, or a 100 μm feature size with 70% density. Each of Polishing Compositions 6A-6D contained 0.285 wt. % wet-process ceria particles, 500 ppm picolinic acid, and water, and was pH-adjusted to pH 4.0 using triethanolamine. In particular, each of Polishing Compositions 6A-6D contained 0.14 wt. % wet-process ceria particles having a median particle size of about 103 nm (i.e., first abrasive particles) and 0.14 wt. % wet-process ceria particles having a median particle size of about 54 nm (i.e., second abrasive particles), Polishing Compositions 6B-6D also contained GOHSEFIMER K210™ polyvinyl alcohol product in the amounts listed in Table 7.

The TEOS pattern wafers were polished with Polishing Compositions 6A-6D under the same polishing conditions. In particular, the wafers were polished on a Mirra™ polisher (Applied Materials) with an IC 1010™ pad (Dow Chemical). The polishing parameters were as follows: 20.68 kPa (3 psi) downforce, 100 rpm platen speed, 85 rpm head speed, and 150 mL/min polishing flow. Following polishing, the removal rate of the pattern TEOS was determined in Å/min. The remaining TEOS step height (Å) and trench loss (Å) were determined after 0 seconds of polishing ("0 s"), after 30 seconds of polishing ("30 s"), after 45 seconds of polishing ("45 s"), after 60 seconds of polishing ("60 s"), and after 75 seconds of polishing ("75 s"), at both the 50% of the 500 μm feature (as indicated in Table 8) and at 70% of the 100 μm feature (as indicated in Table 9). The results are summarized in Tables 8 and 9.

TABLE 7

Pattern Silicon Oxide Removal Rates as a Function of Cationic Polymer

| Polishing Composition | Amount of GOHSEFIMER K210 ™ polyvinyl alcohol product (ppm) | Pattern TEOS Removal Rate (Å/min) |
|---|---|---|
| 6A (comparative) | 0 | 6883 |
| 6B (inventive) | 1 | 7296 |
| 6C (inventive) | 2 | 7178 |
| 6D (inventive) | 5 | 7191 |

TABLE 8

Remaining Silicon Oxide Step Height and Trench Loss at 50% of 500 μm Feature, as a Function of Cationic Polymer

| Polishing Composition | Trench Loss (Å) | | | | | Remaining Step Height (Å) | | | | |
|---|---|---|---|---|---|---|---|---|---|---|
| | 0 s | 30 s | 45 s | 60 s | 75 s | 0 s | 30 s | 45 s | 60 s | 75 s |
| 6A (comparative) | 0 | 194 | 611 | 1587 | 2533 | 8000 | 4752 | 3002 | 1716 | 872 |
| 6B (inventive) | — | — | — | 736 | — | — | — | — | 1465 | — |
| 6C (inventive) | — | — | — | 582 | — | — | — | — | 1433 | — |
| 6D (inventive) | — | — | — | 515 | — | — | — | — | 1348 | — |

TABLE 9

Remaining Silicon Oxide Step Height and Trench Loss at 70% of 100 μm Feature, as a Function of Cationic Polymer

| Polishing Composition | Trench Loss (Å) | | | | | Remaining Step Height (Å) | | | | |
|---|---|---|---|---|---|---|---|---|---|---|
| | 0 s | 30 s | 45 s | 60 s | 75 s | 0 s | 30 s | 45 s | 60 s | 75 s |
| 6A (comparative) | 0 | −17 | 6 | 291 | 1107 | 8000 | 5044 | 3358 | 1556 | 542 |
| 6B (inventive) | — | — | — | 111 | — | — | — | — | 1651 | — |

TABLE 9-continued

Remaining Silicon Oxide Step Height and Trench Loss at 70% of 100 μm Feature, as a Function of Cationic Polymer

| Polishing Composition | Trench Loss (Å) | | | | | Remaining Step Height (Å) | | | | |
|---|---|---|---|---|---|---|---|---|---|---|
| | 0 s | 30 s | 45 s | 60 s | 75 s | 0 s | 30 s | 45 s | 60 s | 75 s |
| 6C (inventive) | — | — | — | 80 | — | — | — | — | 1663 | — |
| 6D (inventive) | — | — | — | 47 | — | — | — | — | 1722 | — |

Figure 4:
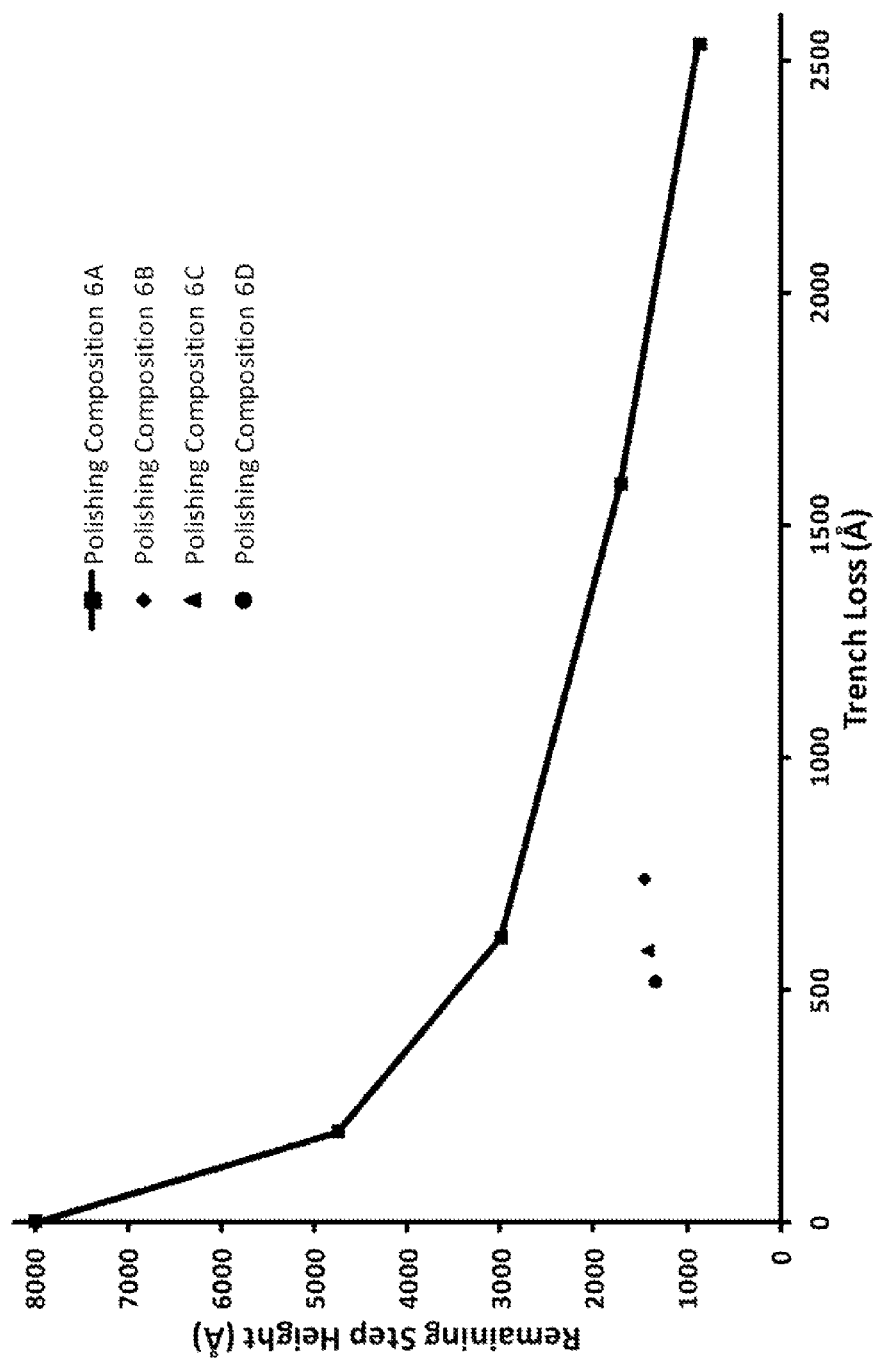
FIG. 4 illustrates the remaining step height (Å) versus trench loss (Å) on a 500 μm feature with 50% density for polishing compositions including a cationic polymer that is a cationic polyvinylalcohol (i.e., Polishing Compositions 6B-6D), as well as for a polishing composition which does not include a cationic polymer (i.e., Polishing Composition 6A).
Figure 5:
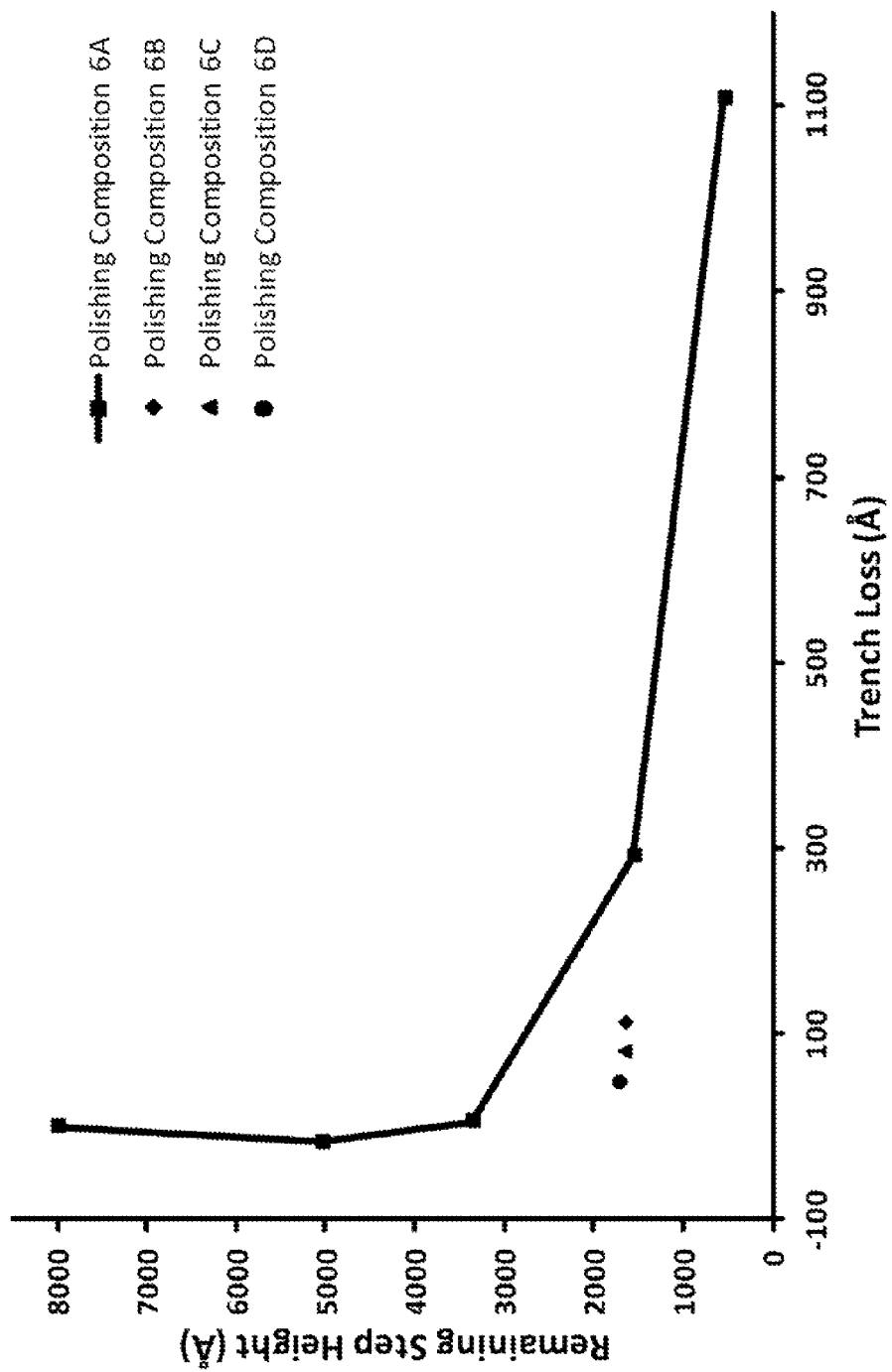
FIG. 5 illustrates the remaining step height (Å) versus trench loss (Å) on a 100 μm feature with 70% density for polishing compositions including a cationic polymer that is a cationic polyvinylalcohol (i.e., Polishing Compositions 6B-6D), as well as for a polishing composition which does not include a cationic polymer (i.e., Polishing Composition 6A).

These results demonstrate that a polishing composition comprising a cationic polymer selected from a cationic polyvinyl alcohol and a cationic cellulose (i.e., GOHSEFIMER K210™ polyvinyl alcohol product) provides improved planarization efficiency. FIGS. 4 and 5 illustrate the relationship between the trench loss (Å) and the remaining step height (Å) for Polishing Composition 6A, which does not contain a cationic polymer, and for Polishing Compositions 6B-6D, which contain GOHSEFIMER K210™ polyvinyl alcohol product. As illustrated by FIG. 4 (showing polishing results at 50% of a 500 μm feature), and by FIG. 5 (showing polishing results at 70% of 100 μm feature) Polishing Compositions 6B-6D exhibited lower trench loss as polishing progressed, and as the remaining step height was reduced. In addition, as illustrated by Table 7, Polishing Compositions 6B-6D provided improved pattern TEOS removal rates as compared to the pattern TEOS removal rate of Polishing Composition 6A. Thus, these results demonstrate that Polishing Compositions 6B-6D provide an improved planarization efficiency as compared to Polishing Composition 6A, across a range of feature sizes.

All references, including publications, patent applications, and patents, cited herein are hereby incorporated by reference to the same extent as if each reference were individually and specifically indicated to be incorporated by reference and were set forth in its entirety herein.

The use of the terms "a" and "an" and "the" and "at least one" and similar referents in the context of describing the invention (especially in the context of the following claims) are to be construed to cover both the singular and the plural, unless otherwise indicated herein or clearly contradicted by context. The use of the term "at least one" followed by a list gone or more items (for example, "at least one of A and B") is to be construed to mean one item selected from the listed items to or B) or any combination of two or more of the listed items (A and B), unless otherwise indicated herein or clearly contradicted by context. The terms "comprising," "having," "including," and "containing" are to be construed as open-ended terms (i.e., meaning "including, but not limited to,") unless otherwise noted. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the invention and does not pose as limitation on the scope of the invention unless otherwise claimed. No language in the specification should be construed as indicating any non-claimed element as essential to the practice of the invention.

Preferred embodiments of this invention are described herein, including the best mode known to the inventors for carrying out the invention. Variations of those preferred embodiments may become apparent to those of ordinary skill in the an upon reading the foregoing description. The inventors expect skilled artisans to employ such variations as appropriate, and the inventors intend for the invention to be practiced otherwise than as specifically described herein. Accordingly, this invention includes all modifications and equivalents of the subject matter recited in the claims appended hereto as permitted by applicable law. Moreover, any combination of the above-described elements in all possible variations thereof is encompassed by the invention unless otherwise indicated herein or otherwise clearly contradicted by context.

The invention claimed is:

1. A chemical-mechanical polishing composition comprising:
   (a) first abrasive particles, wherein the first abrasive particles are wet-process ceria particles, have a median particle size of about 75 nm to about 200 nm, and are present in the polishing composition at a concentration of about 0.005 wt. % to about 2 wt. %,
   (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, wherein the functionalized nitrogen-containing heterocycle is selected from the group consisting of picolinic acid, picolylamine, quinaldic acid, and combinations thereof,
   (c) a cationic polymer, wherein the cationic polymer is a quaternary amine, and wherein the cationic polymer is present in the polishing composition at a concentration of about 1 ppm to about 250 ppm,
   (d) a carboxylic acid, wherein the pKa of the carboxylic acid is about 1 to about 6, and wherein the carboxylic acid is present in the polishing composition at a concentration of about 25 ppm to about 500 ppm,
   (e) a pH-adjusting agent wherein the pH-adjusting agent is triethanolamine, and
   (f) an aqueous carrier,
   wherein the pH of the polishing composition is about 1 to about 6, and wherein the pH of the polishing composition is within about 2 units of the pKa of the carboxylic acid.

2. The chemical-mechanical polishing composition of claim 1, wherein the first abrasive particles are present in the polishing composition at a concentration of about 0.1 wt. % to about 0.5 wt. %.

3. The chemical-mechanical polishing composition of claim 1, wherein the polishing composition further comprises second abrasive particles, and wherein the second abrasive particles are wet-process ceria particles, have a median particle size of about 1 nm to about 60 nm, and are present in the polishing composition at a concentration of about 0.005 wt. % to about 2 wt. %.

4. The chemical-mechanical polishing composition of claim 3, wherein the first abrasive particles and the second abrasive particles, in total, are present in the polishing composition at a concentration of about 0.1 wt. % to about 0.5 wt. %.

5. The chemical-mechanical polishing composition of claim 1, wherein the functionalized heterocycle comprises a functionalized nitrogen-containing heterocycle, and wherein the functionalized nitrogen-containing heterocycle is picolinic acid.

6. The chemical-mechanical polishing composition of claim 1, wherein the functionalized heterocycle comprises a functionalized nitrogen-containing heterocycle, and wherein the functionalized nitrogen-containing heterocycle is quinaldic acid.

7. The chemical-mechanical polishing composition of claim 1, wherein the cationic polymer is poly(vinylimidazolium).

8. The chemical-mechanical polishing composition of claim 7, wherein the poly(vinylimidazolium) is present in the polishing composition at a concentration of about 1 ppm to about 5 ppm.

9. The chemical-mechanical polishing composition of claim 1, wherein the pKa of the carboxylic acid is about 3.5 to about 5.

10. The chemical-mechanical polishing composition of claim 9, wherein the carboxylic acid is acetic acid.

11. The chemical-mechanical polishing composition of claim 1, wherein the pH of the polishing composition is about 3.5 to about 5.

12. A chemical-mechanical polishing composition comprising:
    (a) first abrasive particles, wherein the first abrasive particles are wet-process ceria particles, have a median particle size of about 75 nm to about 200 nm, and are present in the polishing composition at a concentration of about 0.005 wt. % to about 2 wt. %,
    (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm,
    (c) a cationic polymer selected from a cationic polyvinyl alcohol and a cationic cellulose, wherein the cationic polymer is present in the polishing composition at a concentration of about 1 ppm to about 250 ppm,
    (e) a pH-adjusting agent wherein the pH-adjusting agent is triethanolamine, and
    (e) an aqueous carrier,
    wherein the pH of the polishing composition is about 1 to about 6.

13. The chemical-mechanical polishing composition of claim 12, wherein the first abrasive particles are present in the polishing composition at a concentration of about 0.1 wt. % to about 0.5 wt. %.

14. The chemical-mechanical polishing composition of claim 12, wherein the polishing composition further comprises second abrasive particles, and wherein the second abrasive particles are wet-process ceria particles, have a median particle size of about 1 nm to about 60 nm, and are present in the polishing composition at a concentration of about 0.005 wt. % to about 2 wt. %.

15. The chemical-mechanical polishing composition of claim 14, wherein the first abrasive particles and the second abrasive particles, in total, are present in the polishing composition at a concentration of about 0.1 wt. % to about 0.5 wt. %.

16. The chemical-mechanical polishing composition of claim 12, wherein the functionalized heterocycle comprises a functionalized nitrogen-containing heterocycle, and wherein the functionalized nitrogen-containing heterocycle is picolinic acid.

17. The chemical-mechanical polishing composition of claim 12, wherein the functionalized heterocycle comprises a functionalized nitrogen-containing heterocycle, and wherein the functionalized nitrogen-containing heterocycle is quinaldic acid.

18. The chemical-mechanical polishing composition of claim 12, wherein the cationic polymer is a cationic polyvinyl alcohol.

19. The chemical-mechanical polishing composition of claim 18, wherein the cationic polyvinyl alcohol is present in the polishing composition at a concentration of about 1 ppm to about 40 ppm.

20. The chemical-mechanical polishing composition of claim 12, wherein the pH of the polishing composition is about 3.5 to about 5.

21. A method of polishing a substrate comprising:
    (i) providing a substrate;
    (ii) providing a polishing pad;
    (iii) providing the chemical-mechanical polishing composition of claim 1;
    (iv) contacting the substrate with the polishing pad and the chemical-mechanical polishing composition; and
    (v) moving the polishing pad and the chemical-mechanical polishing composition relative to the substrate to abrade at least a portion of the substrate to polish the substrate.

22. A method of polishing a substrate comprising:
    (i) providing a substrate;
    (ii) providing a polishing pad;
    (iii) providing the chemical-mechanical polishing composition of claim 12;
    (iv) contacting the substrate with the polishing pad and the chemical-mechanical polishing composition; and
    (v) moving the polishing pad and the chemical-mechanical polishing composition relative to the substrate to abrade at least a portion of the substrate to polish the substrate.

23. A method of polishing a substrate comprising:
    (i) providing a substrate, wherein the substrate comprises a silicon oxide layer;
    (ii) providing a polishing pad;
    (iii) providing a chemical-mechanical polishing composition comprising:
        (a) first abrasive particles, wherein the first abrasive particles are wet-process ceria particles, have a median particle size of about 75 nm to about 200 nm, and are present in the polishing composition at a concentration of about 0.005 wt. % to about 2 wt. %,
        (b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm, (c) a cationic polymer, wherein the cationic polymer is a quaternary amine, and wherein the cationic polymer is present in the polishing composition at a concentration of about 1 ppm to about 250 ppm,
(d) a carboxylic acid, wherein the pKa of the carboxylic acid is about 1 to about 6, and wherein the carboxylic acid is present in the polishing composition at a concentration of about 25 ppm to about 500 ppm,
(e) a pH-adjusting agent wherein the pH-adjusting agent is triethanolamine, and
(f) an aqueous carrier,
wherein the pH of the polishing composition is about 1 to about 6, and wherein the pH of the polishing composition is within about 2 units of the pKa of the carboxylic acid;
(iv) contacting the substrate with the polishing pad and the chemical-mechanical polishing composition; and
(v) moving the polishing pad and the chemical-mechanical polishing composition relative to the substrate to abrade at least a portion of the silicon oxide layer on a surface of the substrate to polish the substrate.

24. The method of claim 23, wherein the first abrasive particles are present in the polishing composition at a concentration of about 0.1 wt. % to about 0.5 wt. %.

25. The method of claim 23, wherein the polishing composition further comprises second abrasive particles, and wherein the second abrasive particles are wet-process ceria particles, have a median particle size of about 1 nm to about 60 nm, and are present in the polishing composition at a concentration of about 0.005 wt. % to about 2 wt. %.

26. The method of claim 25, wherein the first abrasive particles and the second abrasive particles, in total, are present in the polishing composition at a concentration of about 0.1 wt. % to about 0.5 wt. %.

27. The method of claim 23, wherein the functionalized heterocycle comprises a functionalized nitrogen-containing heterocycle, and wherein the functionalized nitrogen-containing heterocycle is picolinic acid.

28. The method of claim 23, wherein the functionalized heterocycle comprises a functionalized nitrogen-containing heterocycle, and wherein the functionalized nitrogen-containing heterocycle is quinaldic acid.

29. The method of claim 23, wherein the cationic polymer is poly(vinylimidazolium).

30. The method of claim 29, wherein the poly(vinylimidazolium) is present in the polishing composition at a concentration of about 1 ppm to about 5 ppm.

31. The method of claim 23, wherein the pKa of the carboxylic acid is about 3.5 to about 5.

32. The method of claim 31, wherein the carboxylic acid is acetic acid.

33. The method of claim 23, wherein the pH of the polishing composition is about 3.5 to about 5.

34. A method of polishing a substrate comprising:
(i) providing a substrate, wherein the substrate comprises a silicon oxide layer;
(ii) providing a polishing pad;
(iii) providing a chemical-mechanical polishing composition comprising:
(a) first abrasive particles, wherein the first abrasive particles are wet-process ceria particles, have a median particle size of about 75 nm to about 200 nm, and are present in the polishing composition at a concentration of about 0.005 wt. % to about 2 wt. %,
(b) a functionalized heterocycle selected from a functionalized nitrogen-containing heterocycle, a functionalized sulfur-containing heterocycle, a naphthoic acid, and combinations thereof, wherein the functionalized heterocycle is present in the polishing composition at a concentration of about 100 ppm to about 1500 ppm,
(c) a cationic polymer selected from a cationic polyvinyl alcohol and a cationic cellulose, wherein the cationic polymer is present in the polishing composition at a concentration of about 1 ppm to about 250 ppm,
(e) a pH-adjusting agent wherein the pH-adjusting agent is triethanolamine, and
(e) an aqueous carrier,
wherein the pH of the polishing composition is about 1 to about 6;
(iv) contacting the substrate with the polishing pad and the chemical-mechanical polishing composition; and
(v) moving the polishing pad and the chemical-mechanical polishing composition relative to the substrate to abrade at least a portion of the silicon oxide layer on a surface of the substrate to polish the substrate.

* * * * *